(12) United States Patent
Li et al.

(10) Patent No.: US 8,185,811 B2
(45) Date of Patent: May 22, 2012

(54) ROBUST JOINT ERASURE MARKING VITERBI ALGORITHM DECODER

(75) Inventors: Tao Li, Hong Kong (CN); Wai Ho Mow, New Territories (HK); Man Hung Siu, Hong Kong (CN)

(73) Assignee: Kan Ling Capital, L.L.C., Wilmington, DE (US)

( * ) Notice: Subject to any disclaimer, the term of this patent is extended or adjusted under 35 U.S.C. 154(b) by 943 days.

(21) Appl. No.: 12/192,497

(22) Filed: Aug. 15, 2008

(65) Prior Publication Data

US 2009/0052594 A1    Feb. 26, 2009

Related U.S. Application Data

(60) Provisional application No. 60/956,435, filed on Aug. 17, 2007.

(51) Int. Cl.
 *G06F 11/00* (2006.01)

(52) U.S. Cl. .................................................. 714/795

(58) Field of Classification Search .................... 714/795
See application file for complete search history.

(56) References Cited

OTHER PUBLICATIONS

Li et al. A Joint Approach to Erasure Marking and Viterbi Decoding for Imulpsive Noise Channels, IEEE 2003.*

* cited by examiner

*Primary Examiner* — Bryce Bonzo
(74) *Attorney, Agent, or Firm* — Turocy & Watson, LLP

(57) ABSTRACT

Joint erasure marking Viterbi algorithm (JEVA), decoder schemes, methods, and systems are provided which perform robust trellis decoder techniques. The provided JEVA decoding schemes are shown to be maximum likelihood decoding schemes that find the most likely transmitted code sequence with a set of symbol erasures, without knowledge of the impulsive noise probability distribution function, and can be implemented sequentially such that they are well suited for dynamically changing impulsive noise channels. In addition, the disclosed details enable various refinements and modifications according to decoder and system design considerations. For example, truncated JEVA is provided for continuous transmission and long frame applications.

19 Claims, 21 Drawing Sheets

| Decoding schemes | 5dB | 6dB | 7dB | 8dB | 9dB |
|---|---|---|---|---|---|
| (20,1)-GA-JEVA | 2.1 | 1.4 | 1.1 | 1.03 | 1.01 |
| (20,1)-CRC-JEVA | 2.0 | 1.4 | 1.1 | 1.03 | 1.01 |
| (20,1)-PDA-JEVA | 4.4 | 4.5 | 4.1 | 4.4 | 3.8 |
| (3,1)-GA-JEVA | 1.4 | 1.2 | 1.1 | 1.02 | 1.006 |
| (5,1)-GA-JEVA | 1.6 | 1.2 | 1.08 | 1.02 | 1.007 |
| (20,2)-GA-JEVA | 1.4 | 1.1 | 1.04 | 1.01 | 1.003 |
| (20,1)-GA-MP-JEVA | 2.8 | 1.8 | 1.3 | 1.1 | 1.05 |
| (20,1)-PDA-MP-JEVA | 4.2 | 5.1 | 4.1 | 5.4 | 3.9 |
| (10,1)-GA-E-JEVA | 1.5 | 1.1 | 1.04 | 1.01 | 1.006 |
| (10,1)-PDA-E-JEVA | 2.5 | 2.5 | 2.6 | 2.7 | 2.6 |
| (10,1)-GA-E-MP-JEVA | 1.8 | 1.3 | 1.1 | 1.06 | 1.03 |
| (10,1)-PDA-E-MP-JEVA | 2.0 | 2.7 | 2.2 | 2.9 | 1.9 |

FIG. 12

ROBUST JOINT ERASURE MARKING VITERBI ALGORITHM DECODER

CROSS-REFERENCE TO RELATED APPLICATIONS

This application claims the benefit of priority under 35 U.S.C Section 119 from U.S. Provisional Patent Application Ser. No. 60/956,435 entitled "ROBUST JOINT ERASURE MARKING VITERBI ALGORITHM DECODER", filed on Aug. 17, 2007.

TECHNICAL FIELD

The subject disclosure relates to decoding algorithms and more specifically to joint erasure marking Viterbi algorithm decoding including decoding in unknown non-Gaussian noise environments.

BACKGROUND

The explosive growth of wireless services in recent years illustrates the huge and growing demand for the spectrum. Unfortunately, wireless spectrum is a very scarce resource. A promising solution to solve the predicament is the cognitive radio technology.

Cognitive radio technology allows spectrum reuse in various dimensions including space, frequency and time, so as to obliterate the spectrum and bandwidth limitations. It is expected that cognitive radio systems can sense its environment and then alter its transmission power, occupied frequency, modulation and other parameters to dynamically reuse the available spectrum.

In an orthogonal frequency-division multiplexing (OFDM) based cognitive radio system, the transmitter may allocate the data transmission rate to the subcarriers adaptively according to the different detected or approximated channel conditions of the subcarriers. It may simply avoid transmission in the narrow/partial band interference jammed subcarriers to alleviate the destructive effect of the interference.

Unfortunately, spectrum sensing is a challenging research problem and the current sensing techniques cannot guarantee accurate detection of the interference in many practical situations. Coding is essential to achieve an acceptable error rate performance. An optimal decoding in the maximum likelihood sense can be performed given the noise and interference distribution. However, the exact knowledge of the interference distribution is normally hard to obtain in reality.

For example, when the interference is bursty, the transmitter may not be kept updated fast enough and, thus, may not know the existence of the interference in a microscopic time scale (e.g., packet level). Hence, the receiver is required to decode the transmitted packets with acceptable error rate in the presence of unknown interference.

In many real-world communication systems, the channel noise present at the decoder is impulsive noise as well as the background Gaussian noise. For example, in situations such as wireless communications, power line communications and digital subscriber line loops, the non-Gaussian distribution of channel noise results from the presence of impulsive noise, such as narrowband interference for example, in addition to the background Gaussian noise. In such situations, the conventional Euclidean distance based decoder may suffer from the problem of severe metric mismatch.

Various models have been developed to approximate the characteristics of such non-Gaussian noise. However, due to the time-varying nature of the impulsive noise, it is difficult to estimate its distribution accurately. As a result of metric mismatch in the decoder, this can lead to seriously degraded decoder performance. Moreover, the difficulty in selecting an appropriate noise model presents an additional problem. Type-based detection techniques have been proposed for unknown impulsive noise channels that make no assumptions on the noise Probability Density function (PDF). However, these schemes require training sequences, which introduce additional overhead to the transmissions.

One widely used suboptimal receiver that does not require the knowledge of the noise PDF and additional training sequence, is the concatenation of a nonlinear filter with a conventional Gaussian receiver. Commonly used nonlinear filters include the limiter and hole puncher (blanker). It has been shown that the application of the nonlinear filter provides a performance improvement over the conventional Gaussian receiver alone in impulsive noise environment. The hole puncher can be interpreted as an erasure marker, where received signals that fall into particular regions in the signal space are erased. The rationale is that if a received signal is determined to be unreliable, it is better to ignore it rather than use it in further detection process.

Channel coding has also been applied to further mitigate the adverse effect of impulsive noise. The idealized erasure marker, where the impulse positions are exactly known, has been considered in combination with the hard decision Viterbi decoder and the turbo decoder. In one implementation, the received code symbols are first marked by the decision region based erasure marker and then sent to the Euclidean metric based Viterbi decoder to decode. However, the separation of the erasure marker and the decoder leads to less accurate detection of the impulse-corrupted symbols because the code structure is not exploited.

Another fundamental problem in modern wireless communication systems is caused by interference from other communication systems sharing the same frequency band (e.g., narrowband interference). For example, IEEE 802.11g Wireless Local Area Network (WLAN) systems operate in the same frequency band as Bluetooth systems, which are narrowband frequency-hopping systems. For a typical 200 μs long WLAN packet, the probability of collision with a Bluetooth packet is more than 20%. Since the frequency-hopping rate of Bluetooth is relatively high, it is not easy for the WLAN to sense the presence of the Bluetooth transmissions. Moreover, the Bluetooth traffic is bursty since it only transmits data during the first 366 μs of each 625 μs time slot. It is likely that the Bluetooth data packet may only collide with the data part of the WLAN packet without interfering with the pilot symbols. In such situations, the pilot aided interference detection is unable to detect the presence of the interference.

When narrowband interference exists, the noise variance is not a constant for all the subcarriers and dropping the noise variance in the bit metric results in metric mismatch. When the interference power is high, the mismatch problem can be serious. Knowing the interference jammed subcarriers and the power of the interference, the optimal decoder, in the maximum likelihood sense, weights each symbol differently depending on whether the symbol is hit by background Gaussian noise or interference.

Without knowing the impulsive noise probability density function, one promising solution is to identify the symbols that are likely to be corrupted by large amplitude noise and ignore (erase) them in decoding. A reasonable alternative decoding methodology is to simply ignore or erase these jammed symbols in decoding and assume a constant noise variance for the unerased symbols. Since the interference power is normally much larger than the background Gaussian noise power, the performance loss would be small by treating the jammed symbols as erasures. Such an erasure decoding approach avoids the requirement of knowing the interference power. The decoding accuracy then highly depends on the estimation accuracy of the interference positions.

In such examples, interference jammed signals are erased (e.g., ignored) in the decoding process, thus partially avoiding the adverse effect of the interference. Although they do not require the knowledge of the interference power, the decoding schemes need to know the presence of the interference. In one example, the null symbols (zero symbols) are sent as pilots for the receiver to detect the interference. The null symbols, however, increase system overhead and reduce the system throughput. A simple method to detect the interference is based on the magnitude variation of the consecutive received symbols in time or frequency domain. The effectiveness of this method is reduced for high order modulation schemes or when the fading varies significantly. For example, if the interference is estimated based on the rough estimate of the transmitted data symbols, the accuracy of this method is limited by the erroneous estimates of the transmitted data.

As a result, the exact knowledge of the interference distribution is normally hard to obtain in reality. Therefore, it is practically important to design robust decoding schemes that do not require the accurate knowledge of the noise distribution. It is further desired to exploit the code structure in interference detection, to effectively detect almost all the interference jammed symbols while being able to achieve a performance close to that of the optimal maximum likelihood decoder with the full knowledge of the interference distribution. Furthermore, as different decoding problems require different approaches dictated by power usage and availability restrictions, hardware costs and space limitations, and further design considerations, it is further desired to provide alternative decoding schemes that can provide design flexibility and hardware tradeoffs (e.g., computation complexity, decoding delay and memory requirement) while maintaining acceptable decoder error rate performance. Accordingly, a further consideration is to achieve a low error rate while minimizing the decoder complexity.

The above-described deficiencies are merely intended to provide an overview of some of the problems encountered in non-Gaussian decoder design, and are not intended to be exhaustive. Other problems with the state of the art may become further apparent upon review of the description of the various non-limiting embodiments of the disclosed subject matter that follows.

SUMMARY

In consideration of the above-described deficiencies of the state of the art, the disclosed subject matter provides joint erasure marking Viterbi algorithm (VA) decoder algorithms (JEVA), methods, and systems that provide robust trellis decoder techniques and that does not require an estimate of the impulsive noise distribution.

Advantageously, the JEVA schemes can be implemented sequentially such that it can be made suitable for dynamically changing impulsive noise channels. As a further advantage, the disclosed subject matter provides a class of variations JEVA that allow for further memory and hardware complexity reductions, while maintaining acceptable error rate performance.

The disclosed subject matter further provides techniques to improve the JEVA schemes regardless of whether the system incorporates an outer error detecting code. Specifically, JEVA can be integrated with a sufficiency criteria (e.g., an outer error detection code or an internal path metric difference threshold) in order to further improve bit error rate (BER) performance and decoding efficiency, and can be coupled with a separate region based erasure marker to provide additional design flexibility and performance advantages.

According to various nonlimiting embodiments of the disclosed subject matter, the provided JEVA decoding scheme is applied to a convolutional coding system and is shown to be a maximum likelihood decoding scheme that finds the most likely transmitted code sequence with a set of symbol erasures without knowledge of the impulsive noise PDF. The performance of JEVA approaches that of the optimum receiver that exploits the exact impulsive noise PDF. In the systems where error detecting code exists, the JEVA decoding techniques further improve the error rate performance.

Additionally, various modifications are provided, which achieve a wide range of performance-complexity-delay tradeoffs, according to system design considerations.

A simplified summary is provided herein to help enable a basic or general understanding of various aspects of exemplary, non-limiting embodiments that follow in the more detailed description and the accompanying drawings. This summary is not intended, however, as an extensive or exhaustive overview. The sole purpose of this summary is to present some concepts related to the various exemplary non-limiting embodiments of the disclosed subject matter in a simplified form as a prelude to the more detailed description that follows.

BRIEF DESCRIPTION OF THE DRAWINGS

The joint erasure marking Viterbi algorithm decoding techniques, systems, and methods are further described with reference to the accompanying drawings in which:

FIGS. 4 (a-c) illustrate exemplary nonlimiting indicator, bit, and product trellises according various embodiments of the disclosed subject matter, wherein FIG. 4(a) illustrates an indicator trellis for K=2, FIG. 4(b) illustrates a bit trellis for the rate-½ 2-state convolutional code, and FIG. 4(c) illustrates a product trellis for the rate-½ 2-state convolutional code with maximum of K=2 erasures;

FIG. 12 depicts average number of decoding passes for various JEVA schemes in Bernoulli-Gaussian noise channel with p=0.02 and impulsive noise to Gaussian noise ratio (IGR)=15 according to various nonlimiting embodiments of the disclosed subject matter;

FIGS. 13(a-b) depicts performance of a particular nonlimiting embodiment of the disclosed subject matter (e.g., path-metric-difference-aided (PDA) JEVA (PDA-JEVA)) in Bernoulli-Gaussian noise model, wherein FIG. 13(a) depicts the performance for p=0.02 and various IGR, and FIG. 13(b) IGR=15 and various p;

FIGS. 14(a-b) depicts performance of particular nonlimiting embodiments of the disclosed subject matter (e.g., JEVA with fixed number of erasures and with three sufficiency criteria), wherein FIG. 14(a) depicts nonlimiting embodiments without separate erasure marker, and FIG. 14(b) depicts nonlimiting embodiments with separate erasure marker;

DETAILED DESCRIPTION

Overview

Figure 1:
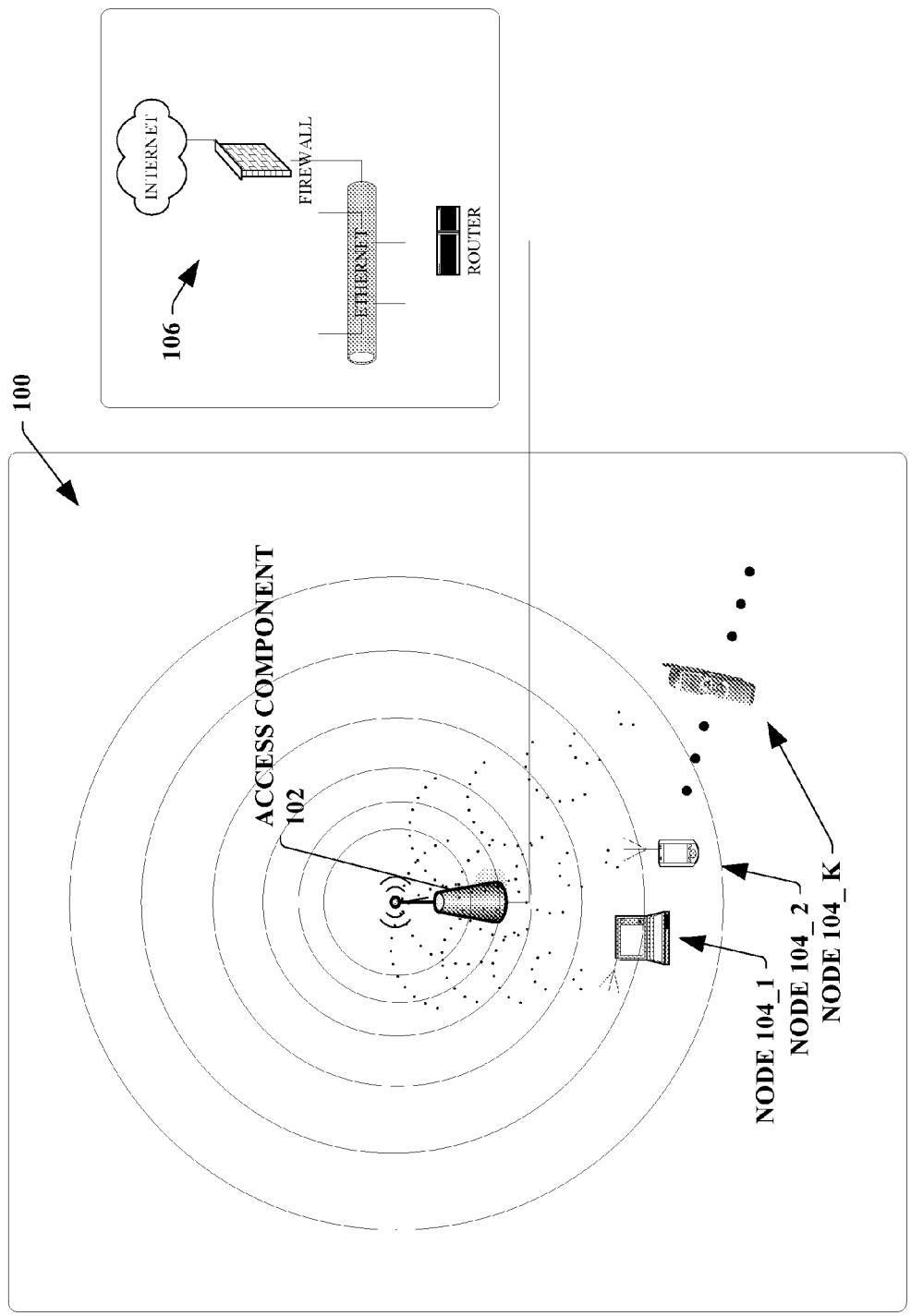
FIG. 1 illustrates an overview of a wireless communication environment suitable for incorporation of embodiments of the disclosed subject matter.

Simplified overviews are provided in the present section to help enable a basic or general understanding of various aspects of exemplary, non-limiting embodiments that follow in the more detailed description and the accompanying drawings. This overview section is not intended, however, to be considered extensive or exhaustive. Instead, the sole purpose of the following embodiment overviews is to present some concepts related to some exemplary non-limiting embodiments of the disclosed subject matter in a simplified form as a prelude to the more detailed description of these and various other embodiments of the disclosed subject matter that follow. It is understood that various modifications may be made by one skilled in the relevant art without departing from the scope of the disclosed invention. Accordingly, it is the intent to include within the scope of the disclosed subject matter those modifications, substitutions, and variations as may come to those skilled in the art based on the teachings herein.

In consideration of the above described limitations of conventional decoding schemes for non-Gaussian noise channels, in accordance with exemplary non-limiting embodiments, the disclosed subject matter provides joint erasure marking Viterbi algorithm (JEVA) decoder algorithms, methods, and systems that provide robust trellis decoder techniques and that do not require an estimate of the noise distribution (e.g., impulsive noise in the time domain for a single-carrier modulation communication signal, narrowband interference in the frequency domain for a multi-carrier modulation communication signal, or other substantially non-Gaussian noise sources, etc.).

According to various nonlimiting embodiments of the disclosed subject matter, the provided JEVA decoding schemes are shown to be maximum likelihood decoding schemes that find the most likely transmitted code sequence with a set of symbol erasures without the impulsive noise PDF. Advantageously, the JEVA schemes can be implemented sequentially such that it can be ideally suited for dynamically changing impulsive noise channels. As a further advantage, the disclosed subject matter provides a class of variations JEVA that allow for further memory and hardware complexity reductions.

The disclosed subject matter further provides techniques to improve the JEVA schemes regardless of whether the system incorporates an outer error detecting code. Specifically, JEVA can be integrated with a sufficiency criteria (e.g., an outer error detection code or an internal path metric difference threshold) in order to further improve bit error rate (BER) performance and decoding efficiency, and can be coupled with a separate region based erasure marker to provide additional design flexibility and performance advantages.

According to various nonlimiting embodiments of the disclosed subject matter, the provided JEVA decoding scheme is applied to a convolutional coding system and is shown to be a maximum likelihood decoding scheme that finds the most likely transmitted code sequence with a set of symbol erasures without knowledge of the impulsive noise PDF. The performance of JEVA approaches that of the optimum receiver that exploits the exact impulsive noise PDF. In the systems where error detecting code exists, the JEVA further improves the error rate performance.

According to further nonlimiting embodiments, the provided decoder techniques may be applied to any data set that can be modeled by a Hidden Markov Model (HMM), or more generally, any data structure suitable for representation as a time-invariant or time-varying trellis.

FIG. 1 is an exemplary, non-limiting block diagram generally illustrating a wireless communication environment 100 suitable for incorporation of embodiments of the disclosed subject matter. Wireless communication environment 100 contains a number of nodes 104 operable to communicate with a wireless access component 102 over a wireless communication medium and according to an agreed protocol. As described in further detail below, such nodes and access components typically contain a receiver and transmitter configured to receive and transmit communications signals from and to other nodes or access components. FIG. 1 illustrates that there can be any arbitrary integral number of nodes, and it can be appreciated that due to variations in transmission path, node characteristics, scattering environment, and other variables, the subject invention is well-suited for use in such a diverse environment. Optionally, the access component 102 may be accompanied by one or more additional access components and may be connected to other suitable networks and or wireless communication systems as described below with respect to FIGS. 19-21.

Figure 2:
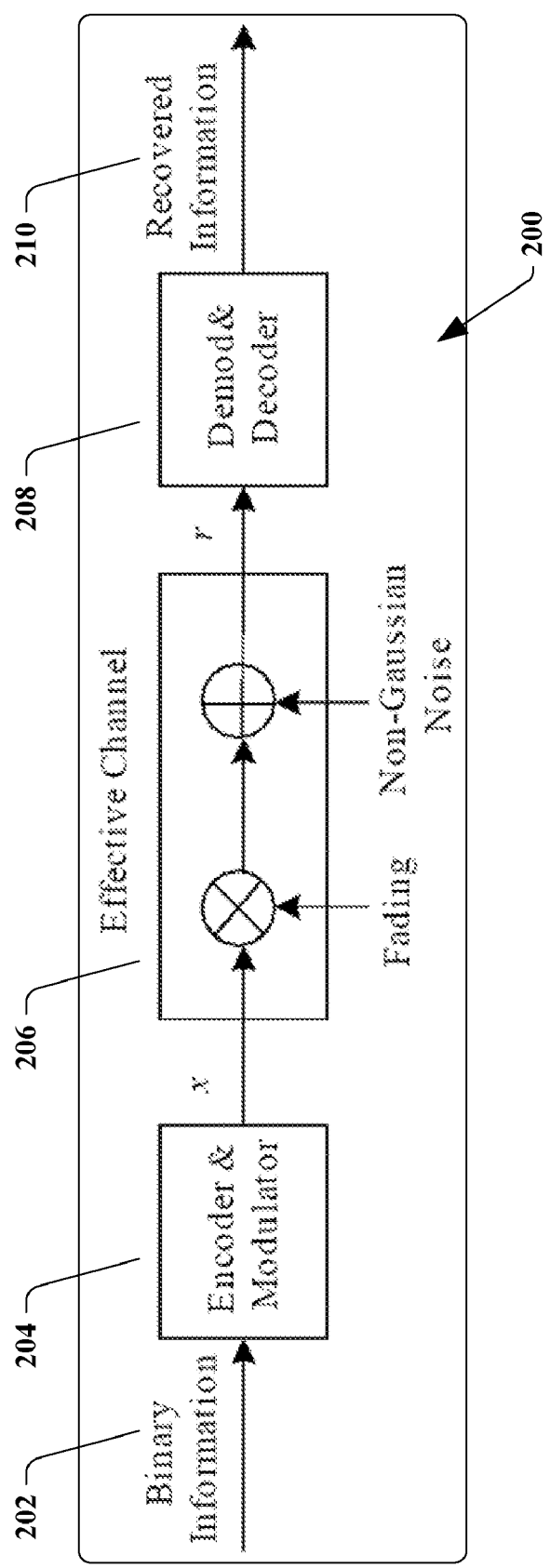
FIG. 2 illustrates an exemplary non-limiting block diagram of a system suitable for practicing embodiments of the disclosed subject matter.

FIG. 2 illustrates an exemplary non-limiting block diagram of a system 200 suitable for practicing embodiments of the disclosed subject matter. Binary information sequences 202 are encoded and modulated at the transmitter side 204. The data sequence is passed through the channel 206 and is demodulated and decoded 208 at the receiver side. It is noted that the effective channel includes all possible processing and noise sources occurring between the modulator and the demodulator.

In most of the works on communications, the transmitted data is assumed to be corrupted by Gaussian noise. The Gaussian model is successful in modeling some important random phenomena, such as thermal noise, and leads to tractable equations. However, in many realistic communication environments, the transmission is additionally disturbed by high amplitude interference so that the overall noise statistics deviate from the Gaussian distribution (including for example, naturally occurring and man-made impulsive noise in wireless communication environments, impulsive noise in wired communication channels, and non-Gaussian interference due to the sharing of communication medium).

For example, impulsive noise has been observed in both outdoor and indoor radio communication environments through extensive measurements. The source of the impulsive noise may be naturally occurring or man-made. Naturally occurring radio frequency sources include atmospheric, solar, and cosmic noise sources. Below 20 MHz, atmospheric noise predominates over other natural sources. From 1 MHz to 10 GHz, the radio noise sources include solar-flare radio-noise radiation, lunar emission and galactic noise. Impulsive noise from automobiles is generated mainly by the ignition system. Impulses arise from the discharge of the coaxial capacitor of the spark plug. The radiated noise exists in the frequency band from 30 MHz up to 7 GHz. In urban areas, the automotive ignition noise is a significant impulsive noise sources. Noise radiated from electric-power generation, transformation, and transport facilities is another important impulsive radio noise source which occurs within the spectral range extending from the fundamental generation frequency (e.g., 50 Hz) into the ultra high frequency band. Gap-discharge and corona-discharge are the major sources of radio interference in the electric-power facilities. The noise in the power-distribution line may be comparable or greater than the automobile ignition noise in rural areas. Impulsive noise measurements for indoor environments have been conducted for the frequency bands from 900 MHz up to 4 GHz, which are currently used or are considered for future indoor wireless systems. The principle sources of radio impulsive noise sources in indoor environments are the devices with electromechanical switches including electric motors in elevators, refrigeration unites, copy machines, printers, etc. The peak amplitude of the impulsive noise can be as large as 40 dB higher relative to the measured thermal noise. The average pulse duration is in the order of a few hundred nanoseconds.

In digital subscriber line (DSL) loops, the impulsive noise is one of the most damaging impairments. In unshielded twisted pairs, impulsive noise can be generated by signaling circuits, transmission and switching gear, electrostatic discharges, lightning surges and so forth. It has been reported that the typical impulsive noise occurs about 1 to 5 times per minute and has a time duration ranging from 30 µs to 150 µs and can exceed 500 µs.

Power lines form a potentially convenient and inexpensive communication medium for their omnipresence even in rural or remote areas where telephone, cable and wireless networks are difficult to cover. Impulsive noise exists in power line communication (PLC) channels and can be categorized into two classes: synchronous and asynchronous impulsive noise. Asynchronous impulsive noise is mainly caused by switching transients that occur all over a power supply network at irregular intervals. Like in DSL loops, the duration of the impulsive noise frequently exceeds the symbol interval. The impulse width is in the order of 100 µs and the interval time is around 100 ms. Normally, the disturbance ratio is less than 1%.

As a result of the explosive growth of wireless services in recent years, growing demand for spectrum-based communications and limited frequency resources have forced the reuse of frequency resources by various users and various communication applications. Accordingly, the users that share the same propagation medium become interference sources for other simultaneous users. Assuming the interfering users are spatially Poisson distributed and under a power-law propagation loss function, it has been shown that the co-channel interference can be modeled as an α-stable distribution. For example, IEEE 802.11g Wireless Local Area Network (WLAN) systems operates in the same frequency band as Bluetooth systems, which are narrowband frequency-hopping systems. For a typical 200 µs long WLAN packet, the probability of collision with a Bluetooth packet is more than 20%.

Multiple access interference in a Code-Division-Multiple-Access (CDMA) system is a wide-band, non-stationary stochastic process. The randomness of the interference comes mainly from three stochastic sources (e.g., radio propagation, traffic variation, and mobile distribution). Furthermore, it has been shown that such interference is bursty in nature. Additionally, the variation in the interference power is relatively large for a small number of users and for a shorter inter-arrival time for packet data calls. The integration of data communication services also increases the variation relative to voice-only communication systems. Moreover, it has been shown that with power control, overall multiple-access interference has "peakings" which come mostly from distant users. This can occur due to perfect tracking of deep fades by only a few users, or even a single dominant user, thus driving the overall interference statistics away from the central limit theorem. These interference distributions are not well studied. It is therefore not straightforward to find a suitable mathematical model for the noise in such wireless communication systems. Similarly, in frequency-hopped (FH) systems, a number of symbols are transmitted during the same dwell interval through a hopped frequency band. Once the transmitted symbols are hopped into the fraction of band where the partial band jammer for other users are present, the symbols become corrupted. Due to the time-varying nature of the impulsive noise, it is difficult to estimate its distribution accurately. In addition, the difficulty in selecting an appropriate noise model presents an additional problem. Without taking the impulsive noise PDF into account, this can result in metric mismatch in the decoder, and can seriously degrade decoder performance. Moreover, the difficulty in selecting an appropriate noise model presents an additional problem. Consequently, it is important to design robust decoding schemes that do not require the accurate knowledge of the noise distribution.

System Model

Figure 3:
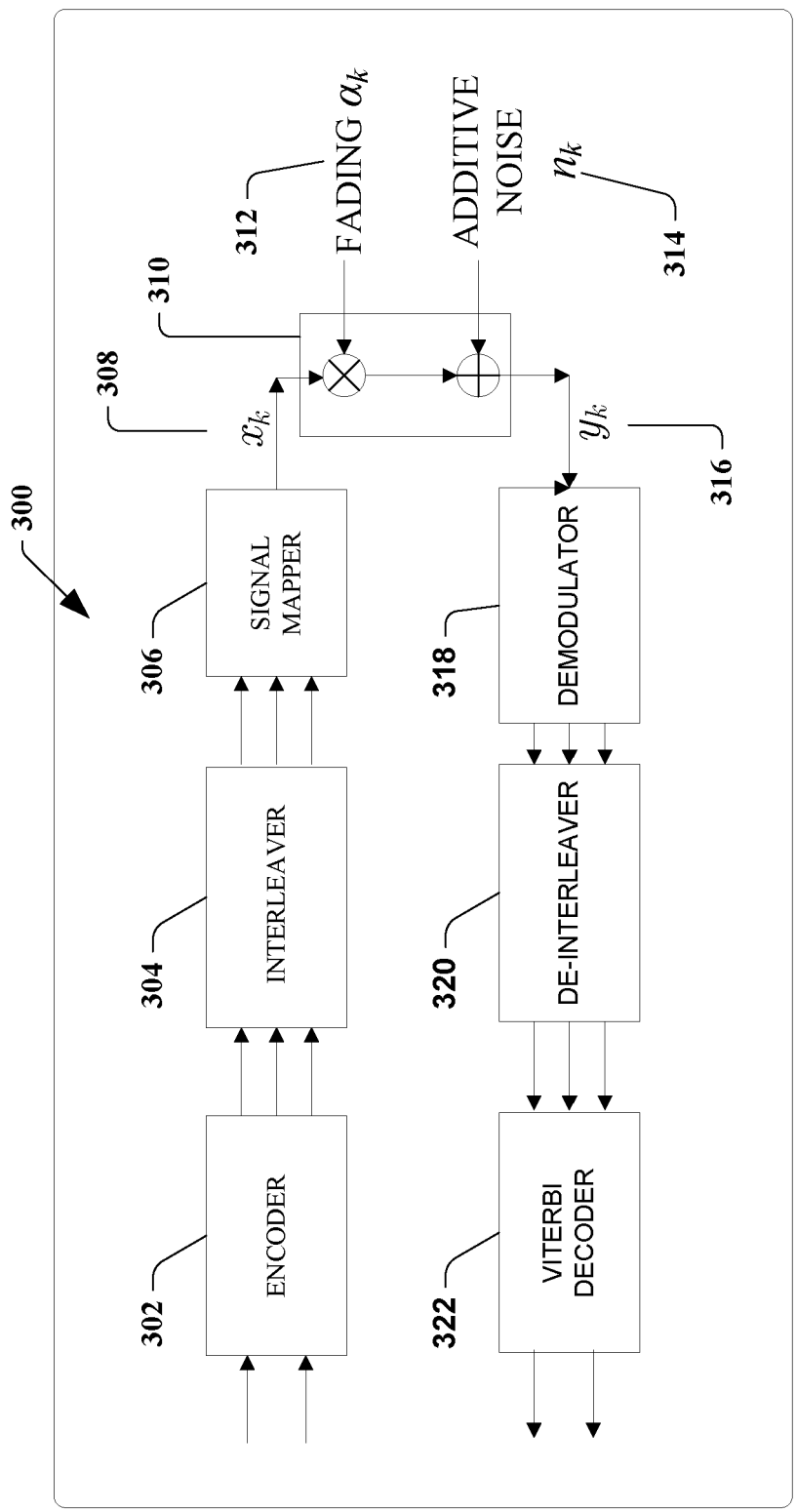
FIG. 3 illustrates an exemplary non-limiting block diagram of a Bit-Interleaved Coded Modulation (BICM) system suitable for incorporation of embodiments of the disclosed subject matter.

FIG. 3 illustrates an exemplary non-limiting block diagram of a Bit-Interleaved Coded Modulation (BICM) system 300 suitable for incorporation of embodiments of the disclosed subject matter. In BICM, the coding and modulation are distinct operations as illustrated in FIG. 3. First, a code is applied to the input data stream in encoder 302. The coded bits (codewords) are then passed through an interleaver 304, and encoded using a mapping 306 from codewords to constellation elements 308 (e.g., 16 QAM with Gray or partition labeling, etc.). After passing through the channel 310, the output 316 is demodulated 318 and de-interleaved 320. Finally, the codeword estimates are decoded 322 (e.g., using a decoder or an iterative decoder). As an example, in coded OFDM systems, the transmitter convolutionally encodes and bit-wise interleaves the information sequence. Such an encoder has been widely adopted in many OFDM-based standards like IEEE 802.11 and 802.16.

The term BICM arises from the fact that it is the coded bits that are interleaved prior to modulation. This contrasts with the "common" interleaving practice, where the encoded symbols themselves are interleaved to obtain independent channel instantiations (fades) to increase the diversity order.

At the transmitter side (302, 304, 306), the information sequence is convolutionally encoded 302 and bit-wise interleaved 304. Every m-tuple $\hat{c}^1, \ldots, \hat{c}^i, \ldots, \hat{c}^m$ of the interleaved binary codeword is mapped to a symbol chosen from an M-ary (M=$2^m$) signal set based on a mapping function $\mu$ 308. Letting $x_k$ 308 represent the kth transmitted symbol, the received signal $y_k$ 316 can be represented as:

$$y_k = \alpha_k \cdot x_k + n_k \qquad \text{Eqn. 1}$$

where $\alpha_k$ is the complex Rayleigh fading factor and $n_k$ is the additive channel noise. The channel noise is assumed to be a composition of the background Gaussian noise and the randomly arrived impulses with an unknown distribution.

Although the disclosed subject matter provides robust decoding algorithms suitable for combating a wide rage of generic impulse noise with unknown distributions, the Bernoulli-Gaussian impulsive noise model is assumed for the purpose of evaluating the algorithms. Accordingly, such noise models should not be understood to be the only suitable environment for implementing the disclosed subject matter. For example, additional environments include, but are not limited to, single-carrier modulation communication signals corrupted by impulsive noise in the time domain, multi-carrier modulation communication signals corrupted by narrowband interference in the frequency domain, and the like.

Mathematically, the discrete-time Bernoulli-Gaussian noise can be represented as:

$$n_k = w_k + b_k \cdot g_k \qquad \text{Eqn. 2}$$

where $b_k$ is the Bernoulli process with parameter p, $w_k$, and $g_k$ are the additive zero mean Gaussian noise with variance $\sigma_G^2$ and $\sigma_I^2 (\sigma_I^2 \gg \sigma_G^2)$, respectively.

DETAILED DESCRIPTION

Robust Decoding for Undetected Interference

Referring back to FIG. 3, the conventional BICM decoding scheme contains a demodulator 318, a deinterleaver 320 and a Viterbi decoder 322. Assuming the noise is Gaussian, the demodulator 318 calculates the metric for all the bits $\hat{c}^i = b$ (b=0, 1; i=1, 2, . . . , m) that correspond to the same symbol $x_k$ as:

$$\lambda(\hat{c}^i = b) = \min_{x_k \in \chi_b^i} |y_k - \alpha_k x_k|^2 \qquad \text{Eqn. 3}$$

where $\chi_b^i = \{\mu([\hat{c}^1, \ldots, \hat{c}^i, \ldots, \hat{c}^m]) | \hat{c}^i = b\}$ represents the signal subset with $\hat{c}^i$ being equal b. After deinterleaving 320, the decoding metric for each codeword $C = [c^1, \ldots, c^i, \ldots, c^N]$ can be obtained by summing up the corresponding bit metrics, e.g., $$\psi_0(C) = \sum_{i=1}^{N} \lambda(c^i) \qquad \text{Eqn. 4}$$

In the presence of impulse noise, the metric in Eqn. 3 gives a mismatched metric for the impulse-corrupted symbols. Without knowing the impulse distribution, one simple yet effective way to mitigate this problem is to treat the impulse-corrupted symbols as erasures. The problem is then how to mark the erasures accurately.

To that end, according to various nonlimiting embodiments of the disclosed subject matter, the decoder jointly performs erasure marking and decoding and is able to erase the interference jammed symbols automatically during the decoding process. Accordingly, the decoding process can be comprised of two steps. First, for a maximum number of K bits to be erased, find the K+1 most likely codewords with each codeword corresponding to a particular number k ($0 \leq k \leq K$) of erasures. In the second step, the sufficient number of erasures can be determined and the corresponding codeword can be selected from the K+1 candidates as the output codeword. The second step determines the number of erasures while the first step determines the positions of the erasures. For k erasures, the decoder jointly finds the most likely codeword and the most likely k erasure positions. Specifically, the decoding metric for codeword c with k erasures can be defined as:

$$\psi_k(c) = \min_{\Omega \in \Lambda} \sum_{i=1, i \notin \Omega}^{N} \lambda(c_i), \qquad \text{Eqn. 5}$$

where $\Lambda$ represents the set of all possible k bit positions in the codeword. The metric in (Eqn. 5) involves searching all possible k erasure positions for each codeword c. For a convolutional code, the minimization problem can be solved by searching for the shortest path in a product trellis that is built based on the erasure trellis and the bit trellis of the code.

Joint Erasure Marking Viterbi Algorithm

A convolutional code can be generated by a finite state machine and represented by a trellis. Let x represent any code sequence which corresponds to a path in the code trellis. For BPSK modulation, the code symbols take two possible values (e.g., $x_i \in \{-1, +1\}$).

The JEVA decoding technique is derived based on the noise model that each noise sample $n_i$ has a probability of p to be the impulse and 1−p to be the Gaussian noise. As described above, the positions and PDF of the impulses can be unknown to the receiver. Conditioned on whether the noise is an impulse or not, the probability that the received symbol $r_i$ given $x_i$ is $$\begin{cases} p(r_i \mid x_i, n_i \text{ is Gaussian noise}) = \\ \frac{1}{\sigma_G \sqrt{2\pi}} \exp\{-(r_i - x_i)^2 / (2\sigma_G^2)\} \\ p(r_i \mid x_i, n_i \text{ is impulse}) = g(x_i, r_i), \end{cases} \quad \text{Eqn. 6}$$

where $g(x_i, r_i)$ is an unknown function representing the PDF of the impulses. For the Bernoulli-Gaussian noise model, $g(x_i, r_i)$ is Gaussian with mean zero and variance $\sigma_G^2 + \sigma_{IN}^2$.

It is preferable to distinguish the received symbols that are corrupted by impulses from those by the Gaussian noise and apply a different decoding metric accordingly. Accordingly, an indicator for each received symbol can be introduced to indicate whether it is corrupted by an impulse. Specifically, the indicator is represented by the binary symbol $e_i$ with 1 meaning that $r_i$ is marked as impulse-corrupted, and 0 meaning otherwise. Further a counter $\epsilon_i$ can be introduced that counts the total number of symbols that are marked as impulse-corrupted from the beginning up to the $i^{th}$ symbol $r_i$. The counter $\epsilon_i$, which depends on its predecessor $\epsilon_{i-1}$ and the present indicator $e_i$, can be shown to be non-decreasing. The counter sequence as well as the indicator sequence can be represented by the indicator trellis, with the counter $\epsilon_i$ being represented by the state and the indicator $e_i$ being represented by the branch label.

While for the purposes of illustration the discussion describes the techniques herein in the context of receiving and decoding communications signal (e.g., OFDM schemes with narrowband interference and convolutional coding schemes in the presence of impulsive noise), it can be appreciated that such techniques can be applied to anything that can be modeled by a Hidden Markov Model (HMM) as will be described in further detail below, or more generally, any data structure suitable for representation as a time-invariant or time-varying trellis. For example, such applications can include, but are not limited to, the following schemes where erasure marking is desired for combating non-Gaussian noise: soft-decision Viterbi algorithms; trellis coded modulation schemes; channels having inter-symbol interference (e.g., viterbi equalizer for wireless channels such as in a GSM system, for magnetic recording in Partial Response Maximum Likelihood (PRML) channels, etc.) pattern recognition techniques (e.g., speech recognition); and computational biology (e.g., Viterbi Exon-Intron Locator techniques). Accordingly, while words such as transmitted and received are used in reference to the described communications processes; it should be understood that such transmitting and receiving is not limited to digital communications systems, but could encompass any manner of sending and receiving data suitable for processing by the described decoding techniques. For example, the data subject to the decoder techniques may be sent and received over any type of communications bus or medium capable of carrying the subject data from any source capable of transmitting such data. As a result, the disclosed subject matter should not be limited to any single embodiment, but rather should be construed in breadth and scope in accordance with the appended claims.

Figure 4:
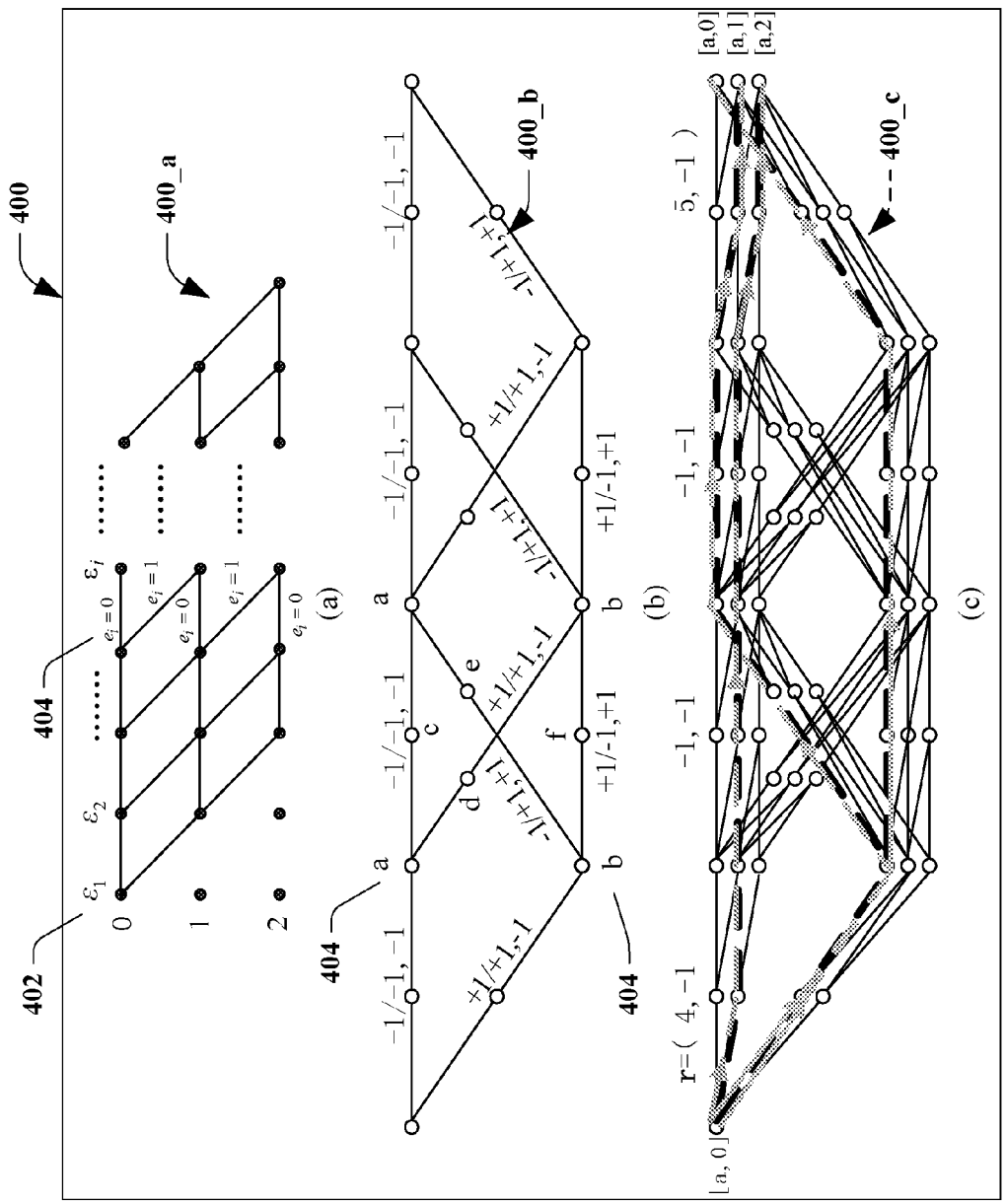

FIGS. 4 (a-c) illustrate exemplary nonlimiting indicator, bit, and product trellises according various embodiments of the disclosed subject matter, wherein FIG. 4(a) illustrates an indicator trellis for K=2, FIG. 4(b) illustrates a bit trellis for the rate-½ 2-state convolutional code, and FIG. 4(c) illustrates a product trellis for the rate-½ 2-state convolutional code with maximum of K=2 erasures. Each path in the trellis corresponds to one possible indicator sequence e. Supposing that the total number of symbols to be marked is constrained to be a fixed number K, the indicator trellis contains K+1 states (e.g., $\epsilon_i \in \{0, 1, \ldots, K\}$). As an example, FIG. 4(a) demonstrates an exemplary indicator trellis $400\_a$ for K=2. The three states 402 then correspond to $\epsilon_i$=0, 1, and 2, respectively.

Derivation of the Algorithm

The algorithm to find the most likely code sequence x* and the indicator sequence e* simultaneously given the received sequence r can be derived by letting $x^{(m)}$ be one of the possible transmitted sequence and $e^{(n)}$ be one of the possible indicator sequence with K symbols being marked. The optimization problem then can be presented as $$(x^*, e^*) = \underset{x^{(m)}, e^{(n)}}{\mathrm{argmax}} p(x^{(m)}, e^{(n)} \mid r) = \underset{x^{(m)}, e^{(n)}}{\mathrm{argmax}} p(r \mid x^{(m)}, e^{(n)}) p(x^{(m)}, e^{(n)}). \quad \text{Eqn. 7}$$

The code sequence and the indicator sequence are statistically independent (e.g., $p(x^{(m)}, e^{(n)}) = p(x^{(m)})p(e^{(n)})$). Because each channel symbol has the same probability to be hit by an impulse, it follows that all indicator sequences are equally likely for a given K. Supposing that each code sequence is also equally likely to be transmitted, thus $p(x^{(m)}, e^{(n)})$ in (Eqn. 7) can be ignored in the optimization. Furthermore, because the channel is memoryless, the conditional probability density function of r given a particular code sequence $x^{(m)}$ and indicator sequence $e^{(n)}$ can be presented as $$p(r \mid x^{(m)}, e^{(n)}) = \prod_{i \geq 0} p(r_i \mid x_i^{(m)}, e_i^{(n)}). \quad \text{Eqn. 8}$$

Thus, the optimization involves calculating the conditional probability for all the possible code sequences and indicator sequences. Inspired by the Viterbi algorithm, the optimization can be formulated into the problem of finding the shortest path of a product trellis $400\_c$ to make the optimization feasible. To construct the product trellis, the convolutional code trellis can first be extended to the bit trellis $400\_b$ by inserting n'−1 intermediate states between any two connected states in adjacent levels, such that each branch in the bit trellis is labeled by a corresponding code symbol, where n' denotes the number of symbols per code trellis branch. The bit trellis $400\_b$ is equivalent to the original code trellis $400\_a$ in the sense they represent the same set of code sequences.

The product trellis $400\_c$ can be obtained as a product of the bit trellis $400\_b$ and the indicator trellis $400\_a$. Supposing that the $i^{th}$ level of the bit trellis can have $N_i$ states $q_i^1, q_i^2, \ldots, q_i^{N_i}$, and the $i^{th}$ level of the indicator trellis $400\_a$ can have $\hat{N}_i$ states $\epsilon_i^1, \epsilon_i^2, \ldots, \epsilon_i^{\hat{N}_i}$. The product of the two trellises is a trellis that consists of $N_i \hat{N}_i$ states at level i, each of which can be represented by a pair $\lfloor q_i^j, \epsilon_i^{\hat{j}} \rfloor$, for j=1, ..., $N_i$, and $\hat{j}$=1, ..., $\hat{N}_i$. Two states $\lfloor q_{i-1}^l, \epsilon_{i-1}^{\hat{i}} \rfloor$ and $\lfloor q_i^j, \epsilon_i^{\hat{j}} \rfloor$ of adjacent levels are connected by a branch labeled by the pair $(x_i, e_i)$ if and only if the two states, $q_{i-1}^l$ and $q_i^j$, in the bit trellis are connected by a branch labeled by $x_i$ and the two states, $\epsilon_{i-1}^{\hat{i}}$ and $\epsilon_i^{\hat{j}}$, in the indicator trellis are connected by a branch labeled by $e_i$. The corresponding branch metric can be defined as $$\phi(x_i, e_i) \overset{\Delta}{=} -\log p(r_i \mid x_i, e_i). \quad \text{Eqn. 9}$$

Each path in the product trellis corresponds to one distinct pair of code sequence and indicator sequence. Therefore, the path with the smallest path metric, obtained by summing the branch metrics, corresponds to the most likely symbol sequence x* with the corresponding indicator sequence e*. For the received symbol $r_i$ marked as impulse-corrupted (e.g., $e_i$=1) the symbol metric should be $-\log[g(x_i, r_i)]$. However, the impulse PDF $g(x_i, r_i)$ is unknown. As a result, instead of estimating the impulse PDF, the symbol metric that corresponds to $e_i$=1 can be ignored. Therefore, the metric for any symbol $r_i$ along the path that corresponds to the code sequence $x^{(m)}$ and indicator sequence $e^{(n)}$ can be simplified as $$\tilde{\phi}(x_i^{(m)}, e_i^{(n)}) = \begin{cases} (r_i - x_i^{(m)})^2, & \text{if } e_i^{(n)} = 0 \\ 0, & \text{if } e_i^{(n)} = 1. \end{cases} \quad \text{Eqn. 10}$$

Given the product trellis and the symbol metric in (Eqn. 10), the most likely path can be obtained in a way similar to the Viterbi algorithm, according various nonlimiting embodiments of the disclosed subject matter. Because this algorithm finds the optimal code sequence and the corresponding optimal erasure positions simultaneously, the technique is named as the joint erasure marking and Viterbi algorithm (JEVA).

It is important to note that the optimal erasure positions are different for different code sequences. Given the received sequence r and the candidate code sequence $x^{(m)}$, according to various nonlimiting embodiments of the disclosed subject matter, JEVA advantageously erases the symbols that correspond to the largest amplitude estimated noise. As a result, for the transmitted code sequence, because the estimated noise is the true channel noise, JEVA always correctly erases the symbols that are corrupted by the largest amplitude channel noise. Therefore, provided JEVA decoding techniques erase the impulse-corrupted symbols more accurately than the separate erasure marking schemes that do not exploit the code structure.

JEVA with a Maximum Number of Erasures

It is interesting to revisit the indicator trellis 400_a. From the example in FIG. 4(a), it can be observed that the trellis possesses a special property such that the trellis structure with K−1 erasures can be reused in building the trellis with K erasures. In other words, a surprising result of the algorithm derivation is that, given the indicator trellis with a maximum of K erasures, the indicator sequences with k ($0 \leq k \leq K$) erasures correspond to the paths that end at state k. Consequently, the most likely code sequences with 0 to K erasures can be obtained during the same decoding process based on the product trellis with a maximum of K erasures. The JEVA with maximum of K erasures is referred to as K-JEVA. This discovery enables the development of the algorithms as described herein.

As an illustrative example, consider the rate-½ 2-state convolutional code. The eight level terminated bit trellis 400_b is presented in FIG. 4(b), where the two states (404) of the original code trellis 400_a are labeled as a and b, while the intermediate states are labeled as c, d, e, and f. The product trellis 400_c with a maximum of K=2 erasures is shown in FIG. 4(c). Each state in the product trellis is labeled by the pair [q,ϵ] where q=a,b,c,d,e,f and ϵ=0,1,2. The most likely path with k ($0 \leq k \leq K$) erasures can be selected among the paths that start from state [a,0] and end at state [a,k]. Suppose that the transmitted and received sequences are x=(−1,−1,−1,−1,−1,−1,−1,−1) and r=(4,−1,−1,−1,−1,−1,5,−1), respectively. The three most likely paths with 0, 1, and 2 erasures are illustrated as the bold dashed paths. Without erasures, the most likely code sequence corresponds to the Viterbi path. The symbol '5' is erased in the most likely one-erasure path and the symbol '4' and '5' are erased in the most likely two-erasure path. With sufficient erasures, the K-JEVA is able to eliminate the large amplitude impulses successfully.

For a rate-k'/n' convolutional code, the Viterbi algorithm has to compute $2^{k'}$n' additions and $2^{k'}-1$ comparisons at each state of the convolutional code trellis in addition to the calculation required for the symbol metrics. For comparison, the K-JEVA requires $2^{k'}$n'(K+1) additions and $(2^{k'}-1)(K+1)+2^{k'}$n'K comparisons for each state. However, the symbol metrics calculated for the Viterbi path can be reused for the paths with erasures. Therefore, the additional computational complexity of K-JEVA relative to the Viterbi algorithm is $2^{k'}$n'K additions and $(2^{k'}+2^{k'}$n'−1)K comparisons for each state. For the rate-½ convolutional codes, the additional complexity is 4K additions and 5K comparisons for each state. It can be observed that the additional complexity increases linearly with the maximum number of erasures K. Similar to the Viterbi algorithm, K-JEVA requires the memory for tracing back the most likely paths. Specifically, the memory requirement is $2^{k'}$(K+1) times that of the Viterbi algorithm.

Sufficiency Criteria for Determining the Number of Erasures

In practice, the number of impulses that hit each code sequence is unknown and has to be determined. Marking too many or too few erasures may degrade the performance. It has been shown that K-JEVA allows the most likely code sequences with 0,1, . . . , K erasures to be found simultaneously, according to various nonlimiting embodiments of the disclosed subject matter. If K is large enough, then the code sequence corresponding to the lowest error rate is among the K+1 candidates. As a result, according to further nonlimiting embodiments, a certain sufficiency criterion can be introduced to the algorithm and applied to determine the number of erasures to be marked.

Accordingly, in a communication system with an outer error detection code, JEVA can be applied as the inner decoder to provide candidate code sequences for the outer decoder to select, according to various nonlimiting embodiments of the disclosed subject matter. If no code sequence passes the error detection test, the receiver can output the last code sequence. Advantageously, the error rate performance is significantly superior to the counterpart decoding scheme with the Euclidean metric based Viterbi algorithm as the inner decoder. For example, the cyclic redundancy check (CRC) codes can be used as the error detecting code, according to various nonlimiting embodiments. As a further example, JEVA with the genie error detecting code, the genie-aided JEVA (GA-JEVA), has shown to serve as the best achievable performance in the simulations.

Alternatively, in communication systems without error detecting codes, an internal path-metric-difference-aided (PDA) criterion can be used to determine the number of erasures to be marked. One result of the trellis coded structure (e.g., in FIG. 4(c)) is that the path metric of the sequence with k−1 erasures is larger than that with k ($1 \leq k \leq K$) erasures. This is obvious if the most likely code sequence with k−1 erasures is identical to that with k erasures. If the two sequences are different, this can be understood by denoting the most likely sequences with k−1 and k erasures by $C_{k-1}$ and $C_k$, respectively. The metric of $C_k$ with k erasures is no larger than the metric of $C_{k-1}$ with k erasures, which is in turn no larger than the metric of $C_{k-1}$ with k−1 erasures.

Consequently, the path metric of the sequence with k erasures output by JEVA is a monotonic non-increasing function of k. Advantageously, in most cases, the high amplitude noise components are erased first. After the high amplitude impulses are erased, the path metric difference resulted from marking further erasures becomes relatively small. Taking advantage of this observation, the proposed PDA criterion works as follows. The path metric difference between two successive most likely code sequences with k−1 and k erasures are evaluated for k=1, 2, . . . , K. If the path metric difference of the sequences with k−1 and k erasures is less than a pre-set threshold η (e.g., with η>0), the code sequence with k−1 erasures is selected as the output code sequence.

If all of the path metric differences are larger than η, then the last code sequence with K erasures is the output sequence. Advantageously, the choice of the PDA threshold η for optimized JEVA performance is rather insensitive to the channel conditions, as is demonstrated by simulation. It is therefore practical to set the PDA threshold by performing a table lookup at the system initialization stage.

Sequential JEVA with Early Stopping

For each received sequence, K-JEVA finds the K+1 most likely code sequences in parallel. Since the number of impulses that hit each transmitted sequence is changing frame by frame, K has to be large enough to deal with the situation when a large number of impulses hit the transmitted sequence. However, the larger K is, the more the states in the product trellis and hence the larger the decoding complexity. On the other hand, the computation is wasted if the actual number of impulses hitting the transmitted sequence is much smaller than K.

As a result of these observations, the disclosed subject matter provides sequential JEVA with early stopping, according to various nonlimiting embodiments of the disclosed subject matter. Advantageously, sequential JEVA with early stopping can achieve the same performance as the K-JEVA but at a lower average computational complexity. Because of the repetitive structure of the indicator trellis $400\_a$, the state metrics with k−1 erasures together with the symbol metrics provide sufficient information for calculating the state metrics with k ($1 \leq k \leq K$) erasures in the product trellis. This surprising result enables the whole product trellis with a maximum of K erasures to be computed in sequential decoding passes instead of in one decoding pass.

Accordingly, during each decoding pass, the state metrics with one more erasure can be calculated based on the previously calculated state metrics. The decoding process can be stopped once a candidate code sequence satisfies the sufficiency criterion (e.g., an outer error detecting code or PDA criterion). Advantageously, such a decoding scheme allows the decoder to mark erasures adaptively depending on the Impulsive Noise (IN) channel conditions while maintaining identical performance as the K-JEVA with the same sufficiency criterion, according to various nonlimiting embodiments of the disclosed subject matter. For example, supposing that the decoder stops after marking k ($1 \leq k \leq K$) erasures, the computational complexity is identical to that of the k-JEVA.

As a simple case, the provided algorithm can be realized by performing the 1-JEVA iteratively, according to one aspect of the disclosed subject matter. For example, in the first decoding pass, the 1-JEVA can be performed to obtain the most likely code sequences with zero and one erasure. After each decoding pass, the zero-erasure state metrics can be replaced by the one-erasure state metrics. During the next decoding pass, based on the updated zero-erasure state metrics, the one-erasure state metrics can be calculated to obtain the most likely code sequence with one more erasure. Advantageously, such an algorithm has hardware complexity similar to that of 1-JEVA and is much lower than that of the K-JEVA.

One additional requirement of such an algorithm is that, to trace back the most likely path with k ($1 \leq k \leq K$) erasures, the surviving paths at all the states with 0 to k erasures are needed. While the algorithm advantageously does not necessarily go through all the K erasures for every received sequence, the memory has to be large enough to store all the surviving paths with 0 to K erasures for the worst case corruption scenario. As a result, it requires the same amount of memory to store the surviving paths as the K-JEVA. However, on one hand, the sequential JEVA only needs to store the state metrics of a single level of 1-JEVA at any time. On the other hand, unlike the K-JEVA, it needs extra memory to store all the one-erasure state metrics of 1-JEVA. As should be understood, the memory size required is proportional to the length of the code sequence. Because the maximum number of erasures is generally much less than the code length in practical applications, the sequential JEVA reduces the complexity of the K-JEVA at the expense of a higher memory requirement.

As a tradeoff, because the decoding is performed through multiple passes, sequential JEVA requires a longer decoding delay relative to K-JEVA. As a further trade off between the decoding delay and computational complexity, more than one erasures may be marked in each decoding pass so that the number of decoding passes can be reduced, according to further nonlimiting embodiments of the disclosed subject matter. For example, letting (K,Q)-JEVA represent the generalized algorithm with Q ($1 \leq Q \leq K$) erasures being marked in each decoding pass and the maximum allowable number of erasures being K, then the average number of decoding passes is P ($P \leq K/Q$), and the (K,Q)-JEVA has an average decoding delay equal to P times that of K-JEVA. As a result, hardware complexity of (K,Q)-JEVA is similar to that of the Q-JEVA and its average computational complexity is P times that of the Q-JEVA.

JEVA for Continuous Transmission and Long Frame Applications

As can be appreciated, the per-symbol decoding complexity can be shown to be proportional to the total number of impulses that hit the codeword. As a result, it should be further appreciate that when the codeword is long, the complexity may become unmanageable. Thus, according to further nonlimiting embodiments, the disclosed subject matter provides techniques referred to as truncated JEVA for continuous transmission and long frame applications.

Accordingly, in one aspect of the disclosed subject matter, a sliding window can be applied to truncate the product trellis similar to a truncated VA to facilitate JEVA operating on the truncated trellis (truncated JEVA). As a result, decision can be made on the first information bit in the window. For example, as a window slides along the trellis, an information sequence can be determined bit after bit. The truncated JEVA needs to determine from which state of the product trellis to start the traceback in each window. According to an aspect of the disclosed subject matter, it can select the code state with the smallest accumulated path metric at the end of each window, similar to the VA. According to a further aspect, the disclosed subject matter can determine the indicator state that corresponds to the number of erasures.

For example, suppose at the end of the $i^{th}$ window (e.g., the sliding window beginning at time i), the e-erasure state with the smallest path metric can be selected for performing the traceback. At the end of the $(i+1)^{th}$ window, either the (e+1)-erasure state or the e-erasure state can be selected depending on whether the decision of the first information bit in the $i^{th}$ window is determined to be an erasure or not. It can be appreciated that as the window slides, the accumulated number of erasures increases. At the first glance, it seems that the product trellis can still contain a huge number of states for long codewords. However, according to a further aspect, embodiments of the disclosed subject matter can reduce the memory required for storing the surviving path for each state from the codeword length to the window size only.

Additionally, according to a further aspect, not all the states in the product trellis have to be evaluated. For example, the efficient implementation of the truncated JEVA reveals that once a bit at time t is marked as the $(k+1)^{th}$ erasure, all states associated with k or less erasures need not be considered from that point forward, because the number of erasures is non-decreasing with time. Accordingly, to limit the computational complexity, the truncated JEVA can further provide that at every time instant, only states associated with k to k+K erasures, for some k (e.g., k=0), in the product trellis are processed. Advantageously, the value of K can be predetermined or selected such that the probability of having more than K impulses impacting or hitting a window is negligible. Accordingly, the window size of the truncated JEVA can be selected as multiple times the code constraint length to ensure negligible performance loss, similar to the truncated VA.

It should be appreciated that, although the truncated JEVA can be said to be suboptimal compared with particular contexts appropriate for parallel and sequential JEVA, truncated JEVA can advantageously reduce computational complexity and memory requirements as well as the decoding delay. Accordingly, per-symbol decoding complexity of truncated JEVA can be seen to be independent of codeword length or frame length, but is linear in the window size and the maximum number of erasures, K, per window. Thus, truncated JEVA is well-suited for applications involving long data frames or continuous transmission.

Figure 5:
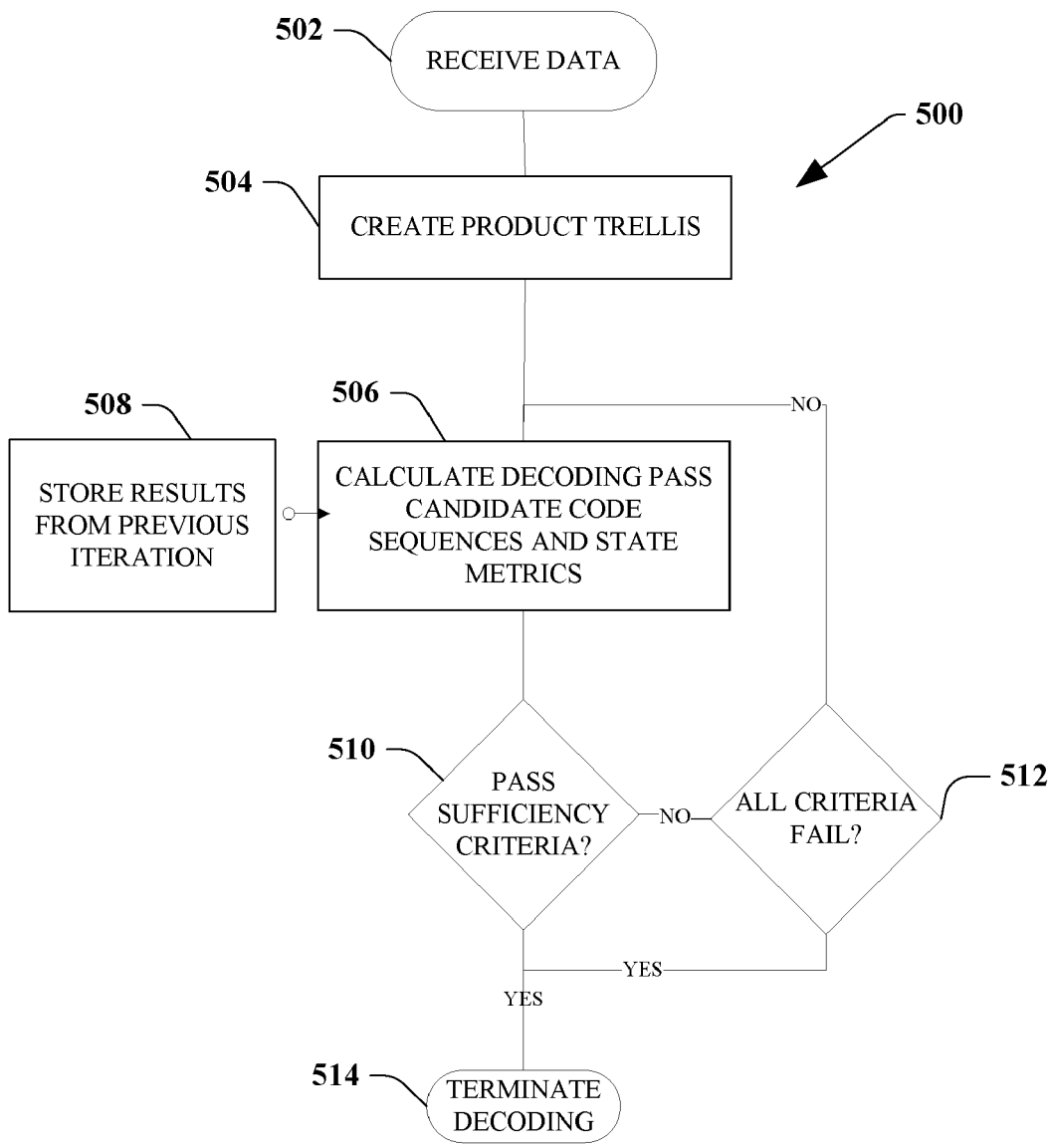
FIG. 5 illustrates an exemplary non-limiting block diagram of methodologies for JEVA decoding according to various embodiments of the disclosed subject matter.

FIG. 5 illustrates an exemplary non-limiting block diagram of methodologies 500 for JEVA decoding according to various embodiments of the disclosed subject matter. For instance, methodologies 500 can provide joint erasure and viterbi decoding of received data. For example, data received at 502 can have a convolutional code trellis representation. In addition, methodologies 500 can include applying a separate erasure marking scheme to the received data (not shown). For example, the separate erasure marking scheme can include, e.g., a region based erasure marking scheme. The methodologies can further include creating a product trellis for the data at 504, for example by extending the convolutional code trellis representation into a bit trellis representation, which product trellis can be obtained as a product of the bit trellis representation and an indicator trellis. The methodologies 500 can further include truncating the product trellis by applying a sliding window to the product trellis and storing a surviving path for the erasure state from the sliding window (not shown). In addition, methodologies 500 can include evaluating a subset of erasure states in the product trellis based on a predetermined number of erasures, where the predetermined number of erasures is determined based on a number of impulses expected to impact the sliding window (not shown).

At 506, a candidate code sequence and corresponding state metric(s) with one or more erasures can be calculated with a decoder. For example, the candidate code sequences can have path metrics obtained by summing branch metrics, where the calculation can be based in part on the path metrics. The results from the iterations (e.g., previous iterations) can be stored for example, at 508. At 510, a determination can be made to test whether the candidate code sequence satisfies a sufficiency criterion or threshold determination. For example, the sufficiency criterion or threshold determination can include, an outer error detection test (e.g., a cyclic redundancy check), an inner path metric difference threshold, a most likely code sequence, or a maximum number of erasures, any combination thereof, and the like.

If the determination at 510 results in a failing the sufficiency criterion, then further iterations can be performed. For example, 506-510 can be repeated to determine a subsequent iteration of candidate code sequences and corresponding state metrics for the data based in part on the calculated state metrics if the calculated candidate code sequences does not satisfy the sufficiency criterion. In addition, the subsequent iterations of candidate code sequences and corresponding state metrics can be further based on the respective erasure positions in previous iteration.

Accordingly at 512, a determination can be made whether all criteria fail. Thus, at 514, the decoding can be stopped if either the calculated or determined candidate code sequences satisfies the sufficiency criterion. In addition methodologies 500 can further comprise outputting the subsequent iteration (not shown) of one or more candidate code sequences if each of the at least one sufficiency criterion remains unsatisfied.

Additionally, according to further non-limiting embodiments of methodologies 500 (not shown), a sliding window can be applied to truncate the product trellis as described above. In addition, the code state with the smallest accumulated path metric at the end of each window can be selected (not shown) depending on whether the decision of the first information bit in the window is determined to be an erasure or not. Moreover, the methodologies 500 can further limit the subset of states in the product trellis that are processed (not shown), for example, by providing that at every time instant, only states associated with a range of erasures are processed. For example, the range of states processed can include k to k+K erasures (e.g., k=0), where K can be selected such that the probability of having more than K impulses hitting a window is negligible.

Figure 6:
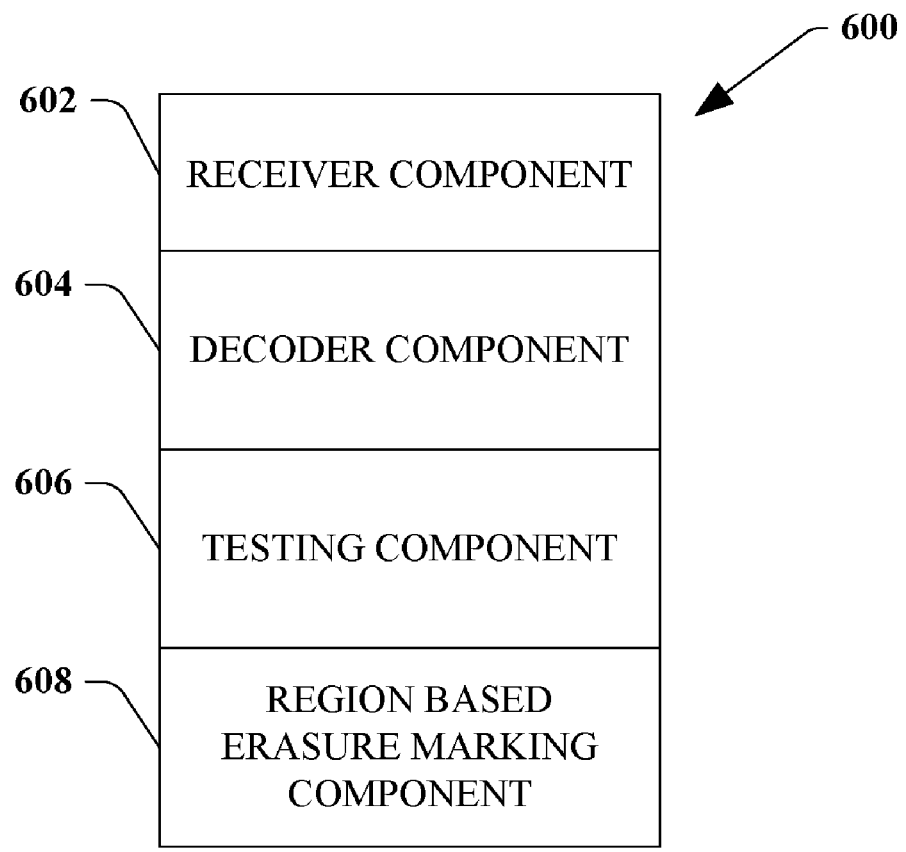
FIG. 6 illustrates an exemplary non-limiting block diagram of systems for JEVA decoding according to various embodiments of the disclosed subject matter.

FIG. 6 illustrates an exemplary non-limiting block diagram of systems for JEVA decoding according to various embodiments of the disclosed subject matter.

For example, systems 600 can comprise a receiving component 602 configured to receive data, for example, data having a convolutional code trellis representation. In addition, the systems 600 can further comprise a decoder component 604 coupled to the receiving component. The decoder component 604 can be configured to perform a joint erasure viterbi decoding to simultaneously determine an optimal code sequence and one or more corresponding optimal erasure positions for the data simultaneously. For example, the decoding can have a number of erasure positions, where the number of erasure positions is less than a maximum allowable erasures.

In addition, according to further aspects of the disclosed subject matter, systems 600 can comprise a testing component 606 configured to test the optimal code sequence against a sufficiency criterion or a threshold determination. For example, the sufficiency criterion or threshold determination can include a cyclic redundancy check. In addition, according to yet further aspects of the disclosed subject matter, systems 600 can comprise a region based erasure marking component configured to mark erasures in the data.

In further nonlimiting embodiments of the disclosed subject matter, decoder component 604 can be configured to apply a sliding window to truncate the product trellis as described above. In addition, the testing component can be configured to select the code state with the smallest accumulated path metric at the end of each window depending on whether the decision of the first information bit in the window is determined to be an erasure or not. Moreover, the systems can further limit the subset of states in the product trellis that are processed (e.g., by decoder component 604), for example, by providing that at every time instant, only states associated with a range of erasures are processed. For example, the range of states processed by decoder 604 can include k to k+K erasures (e.g., k=0), where K can be selected such that the probability of having more than K impulses hitting a window is negligible.

Memory Reduction Via Erasure Feedback

As described above, (K,Q)-JEVA with sufficiency criteria requires a large memory to store the surviving paths at each state for large K. To advantageously reduce the memory requirement, a further class of JEVA variants is provided to allow additional design tradeoffs, according to further non-limiting embodiments of the disclosed subject matter. Similar to the (K,Q)-JEVA, the algorithms of this class find the erasure positions through multiple decoding passes. During each decoding pass, a certain number of erasures are made. These erasure positions act as inputs to the next decoding pass. Because not all the erasures are obtained jointly, these algorithms can be suboptimal in error rate performance compared to the previously described JEVA variants. This class of algorithms is named the multi-pass JEVA (MP-JEVA), the flow chart for various nonlimiting embodiments of which is shown in FIG. 7.

Figure 7:
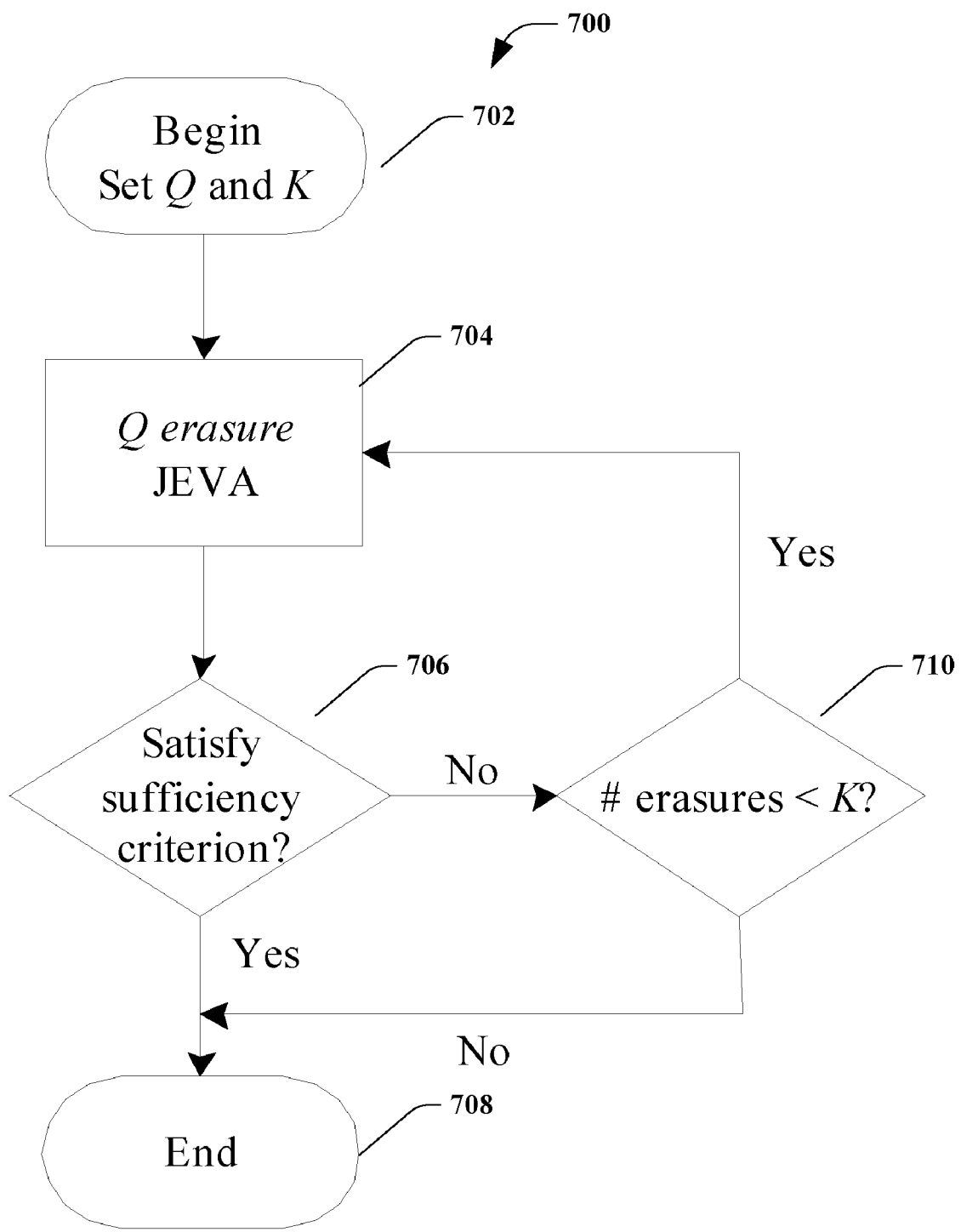
FIG. 7 illustrates an exemplary non-limiting block diagram of a flow chart of (K,Q)-MP-JEVA, according to an aspect of the disclosed subject matter.

FIG. 7 illustrates an exemplary non-limiting block diagram of a flow chart of (K,Q)-MP-JEVA, according to an aspect of the disclosed subject matter. For each decoding pass of MP-JEVA, either Q-JEVA, (Q,I)-JEVA ($1 \leq I \leq Q$) or other possible variants can be applied. The combinations of these decoding schemes provide complexity, memory, decoding delay and error rate performance design tradeoffs. The tradeoff between K-JEVA and (K,Q)-JEVA are discussed above. As a result, only K-JEVA for each decoding pass of MP-JEVA is described herein. Supposing that the maximum erasure number of MP-JEVA is K and Q erasures are marked during each decoding pass, the MP-JEVA is denoted as (K,Q)-MP-JEVA. The (K,Q)-MP-JEVA serially performs Q-JEVA for multiple decoding passes until K erasures are marked. After the first decoding pass, the Q erasure positions corresponding to the maximum likelihood code sequence with Q erasures, are fixed. That is, further decoding passes will regard these symbols as already erased. After the second decoding pass, Q more erasures are marked. As discussed above, if the erased symbols are not the impulse corrupted symbols, then fixing these erasure positions for further decoding process makes the (K,Q)-MP-JEVA prone to error propagation as compared to the K-JEVA and (K,Q)-JEVA algorithms with sufficiency criteria.

However, because the memory can be advantageously reused for each decoding pass, the memory requirement is identical to that of the Q-JEVA. The hardware implementation is also identical to that of the Q-JEVA. Furthermore, the computation complexity and the decoding delay are the summation of all the decoding passes performed.

Figure 8:
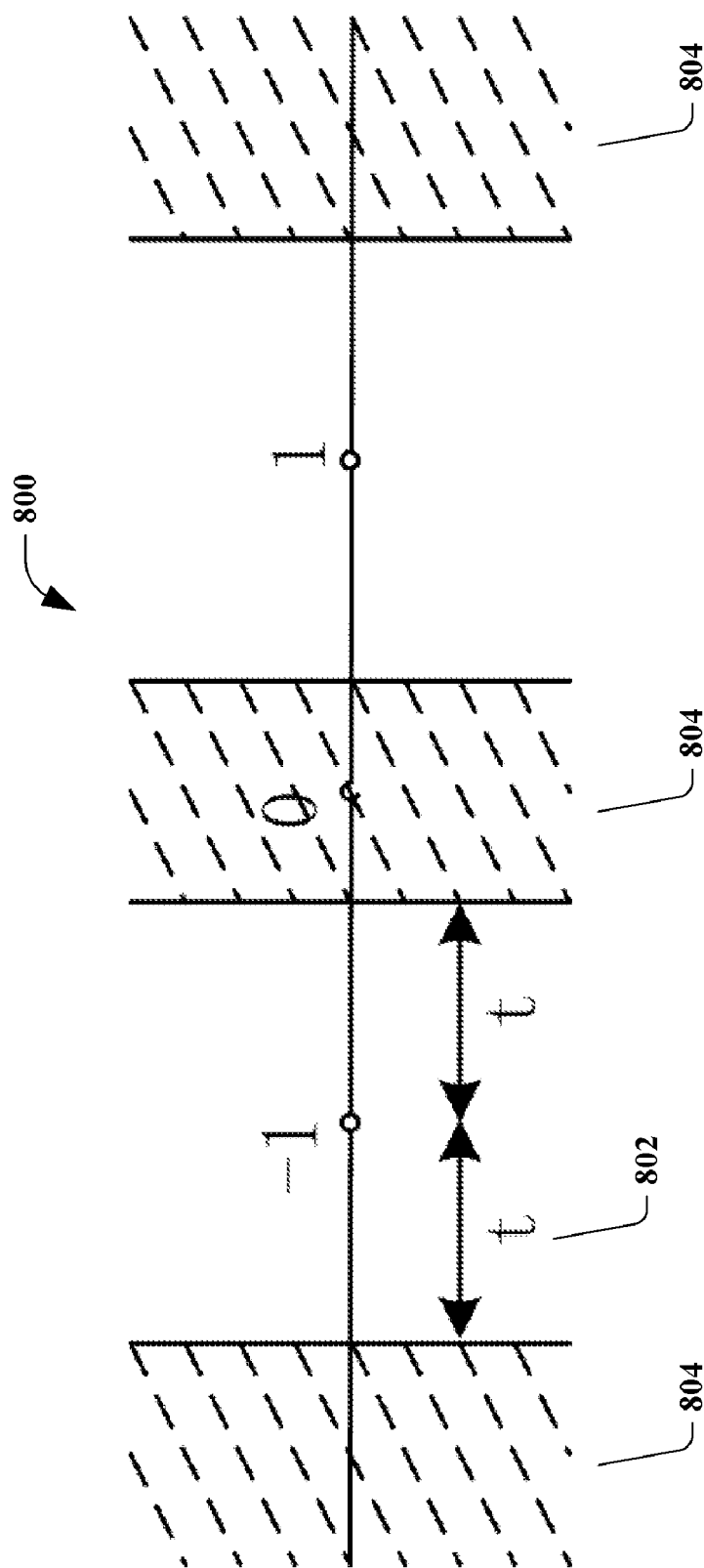
FIG. 8 illustrates an exemplary non-limiting signal space partitioning method associated with region-based erasure marker (e.g., a hole puncher) for Binary Phase-Shift Key modulation (BPSK)

According to further nonlimiting embodiments of the disclosed subject matter, with the MP-JEVA framework, a separate erasure marker (e.g., such as that in FIG. 8) can be concatenated with the Viterbi algorithm, which can be regarded as the first decoding pass (referred to as E-JEVA herein). The separate erasure marker can help to erase part of the impulses and, thus, reduce the complexity of JEVA according to an aspect of the disclosed subject matter. As should be understood, the K-E-JEVA is a tradeoff compared to K-JEVA for sufficiently large K. However, if the threshold of the erasure marker in FIG. 8 is large enough, the performance degradation is negligible. Moreover, if K is not sufficiently large, K-E-JEVA can be better than K-JEVA since it erases more erasures.

FIG. 8 illustrates an exemplary non-limiting signal space partitioning method associated with region-based erasure marker (e.g., a hole puncher) for binary phase-shift key modulation (BPSK). A hole puncher can be interpreted as an erasure marker, where the received signals fall into some regions in the signal space are erased. Such an erasure marker has been successfully adopted in impulsive noise channels as well as in fading channels. For example, an erasure marker can be performed preceding the error-and-erasure Euclidean metric based Gaussian decoder. Furthermore, the erasure marker can be implemented by partitioning the whole signal space into the signal regions and the erasure regions and marking all received signals that fall inside the erasure regions as erasures. For an exemplary BPSK system, the region based erasure marker as shown in FIG. 8 can be used, where the erasure region is illustrated by the shaded areas.

Performance Evaluation

Since computer simulations can be very time consuming for low error rate, a resort to theoretical analysis can help understand the behavior of various decoding schemes. The performance can be upper bounded by the widely used union bound, which can be obtained by summing the error probabilities of all the possible code sequence pairs. Alternatively, the Chernoff bound of the Pairwise Error Probability (PEP) with maximum likelihood decoding can be used. Herein, the general expression of the exact PEP in impulsive noise channels for the maximum likelihood decoder (MLD), the conventional Eucliean metric based Viterbi algorithm (VA), and the separate erasure marking and Viterbi algorithm (EVA) are derived.

While the theoretical analysis of JEVA turns out to be very difficult, fortunately, it is found through simulations that JEVA with PDA sufficiency criterion performs very close to the maximum likelihood decoder. Therefore, the MLD bound is useful to predict the performance of various nonlimiting embodiments of the JEVA decoding techniques for low error rate.

MLD and VA

For binary linear code and symmetric channel, PEP depends only on the Hamming distance of the code sequence pairs. Without loss of generality, assume that the transmitted code sequence x is the all −1 sequence and the competitive code sequence x̃ differs from x in the first d positions. The PEP of MLD is therefore $$p_e^{MLD}(d) = P(x \to \tilde{x}) = P\{z < 0 | x\}, \quad \text{Eqn. 11}$$

where $$z \triangleq \sum_{i=1}^{d} \log \frac{P(r_i | x_i)}{P(r_i | \tilde{x}_i)}.$$

The direct calculation of (Eqn. 11) requires a d-dimensional integration. To compute the PEP efficiently, the characteristic function can be adopted. The characteristic function of z is the Laplace transform of the probability density function of z, e.g., $$\Phi_z^{MLD}(s) = E_z[\exp(-sz)]. \quad \text{Eqn. 12}$$

The PEP can then be obtained by performing inverse Laplace transform of $\Phi_z^{MLD}(s)$. That is, $$p_e^{MLD}(d) = \frac{1}{2\pi j} \int_{c-j\infty}^{c+j\infty} \Phi_z^{MLD}(s) \frac{ds}{s}, \quad \text{Eqn. 13}$$

where c belongs to the intersection of the convergence region of $\Phi_z^{MLD}(s)$ with the real positive line. The exact evaluation of the complex integral over the vertical line (c−j∞, c+j∞) involves calculating the residuals, which is often a difficult problem. However, a general efficient calculation method based on the Gauss-Chebyshev quadrature rules can be performed. Since z is the sum of Independent, Identically Distributed (IID) random variables $$\log \frac{P(r_i|x_i)}{P(r_i|\tilde{x}_i)} = \log \frac{f(n)}{f(n-2)} \overset{\Delta}{=} \varphi_{MLD} \quad \text{Eqn. 14}$$

the characteristic function can be rewritten as:

$$\Phi_z^{MLD}(s) = \{E[\exp(-s\varphi_{MLD})]\}^d = \left[\int_{-\infty}^{\infty} \exp(-s\varphi_{MLD})f(n)\,dn\right]^d. \quad \text{Eqn. 15}$$

Therefore, the multi-dimensional integration in (Eqn. 11) is transformed to a one dimensional integration.

The bit error rate performance of a rate-k'/n' convolutional code with optimum decoder is upper bounded by the union bound $$p_b^{ML} \leq \frac{1}{k'} \sum_{d=d_{min}}^{\infty} w_d p_e^{MLD}(d), \quad \text{Eqn. 16}$$

where $d_{min}$ is the minimum Hamming distance of the code and $w_d$ is the total input weight of the error events with Hamming weight d.

The union bound for VA can be obtained similarly by replacing the optimal symbol metric by the Euclidean distance.

EVA

For the separate erasure marker shown in FIG. 8 with signal regions being [−1−t,−1+t] and [1−t,1+t], the probability of a symbol being erased is $$\delta = \int_{-\infty}^{-t} f(n)\,dn + \int_{\min\{t,1\}}^{\max\{2-t,1\}} f(n)\,dn + \int_{2+t}^{\infty} f(n)\,dn. \quad \text{Eqn. 17}$$

Because the channel noise is IID, the erasures are randomly distributed in the code sequence with the probability δ. The cascade of the impulsive noise channel and the erasure marker can be regarded as an equivalent channel with random erasures. The equivalent channel noise PDF is asymmetric and depends on the transmitted symbol, e.g., $$f'(n\,|\,x=-1) = \quad \text{Eqn. 18}$$

-continued $$\begin{cases} \frac{f(n)}{1-\delta}, & -t < n < \min\{t,1\} \text{ or } \max\{2-t,1\} < n < 2+t \\ 0, & \text{otherwise} \end{cases}$$

and f'(n|x=1)=−f'(n|x=−1). Nevertheless, the equivalent channel is still symmetric in the sense that the two possible transmitted symbols are equally likely to make errors.

Consequently, the PEP depends only on the Hamming distance of the code sequence pairs. Supposing the two code sequences differ in d positions after marking erasures, the PEP $p_e^{EVA}(d)$ can be obtained in a way similar to VA except the noise PDF is replaced by (Eqn. 18).

With channel erasures, the code sequence with weight d can have its weight reduced to d−i (0≤i≤d). It can be shown that with random erasures, the average input weight is changed to $$\hat{w}_d = \left[\frac{1-\delta}{\delta}\right]^d \sum_{m=d}^{\infty} \binom{m}{d} w_d \delta^m. \quad \text{Eqn. 19}$$

Consequently, the bit error rate of EVA is bounded by $$p_b^{EVA} \leq \frac{1}{k'} \sum_{d=0}^{\infty} \hat{w}_d p_e^{EVA}(d). \quad \text{Eqn. 20}$$

Simulation Results

In this section, the provided JEVA decoding algorithms and its variants are evaluated and compared with existing algorithms including VA, erasure marker concatenated with VA (EVA), and maximum likelihood decoder (MLD) through computer simulation. The algorithms perform well in the Bernoulli-Gaussian noise channels as well as in the SαS IN model and Middleton Class A noise model channels. The $E_b/N_o$ in Bernoulli-Gaussian model refers to the information to Gaussian noise power ratio.

In the simulations, the code sequence length is 500 BPSK symbols. For the EVA, the threshold t of the region based erasure marker FIG. 8 is selected from the set of discrete values ranging from 0 to 2 with an incremental step size of 0.1. If the best value is found to be at the boundary of the range, the search range is extended and the search will be continued until a non-boundary value is found as the optimal value. For the PDA-JEVA, the threshold η required in the PDA sufficiency criterion is selected from the range of 0 to 10 with an incremental step size of 0.2

Figure 9:
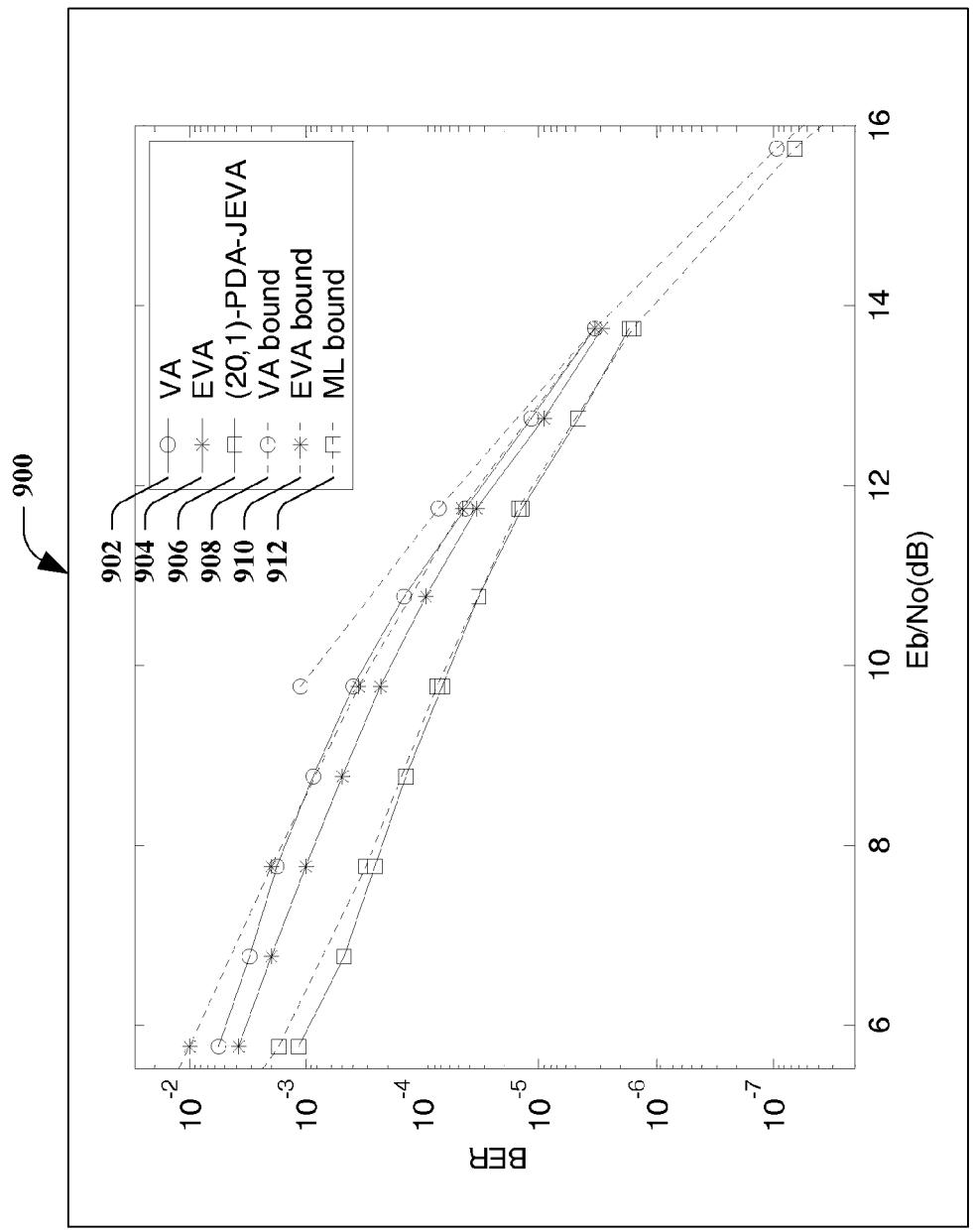
FIG. 9 depicts upper bounds for Viterbi Algorithm (VA), separate erasure marking VA (EVA) and Maximum Likelihood (ML) decoder (MLD) in Bernoulli-Gaussian noise with rate-⅔ 4-state code with a particular nonlimiting embodiment of the disclosed subject matter.
Figure 10:
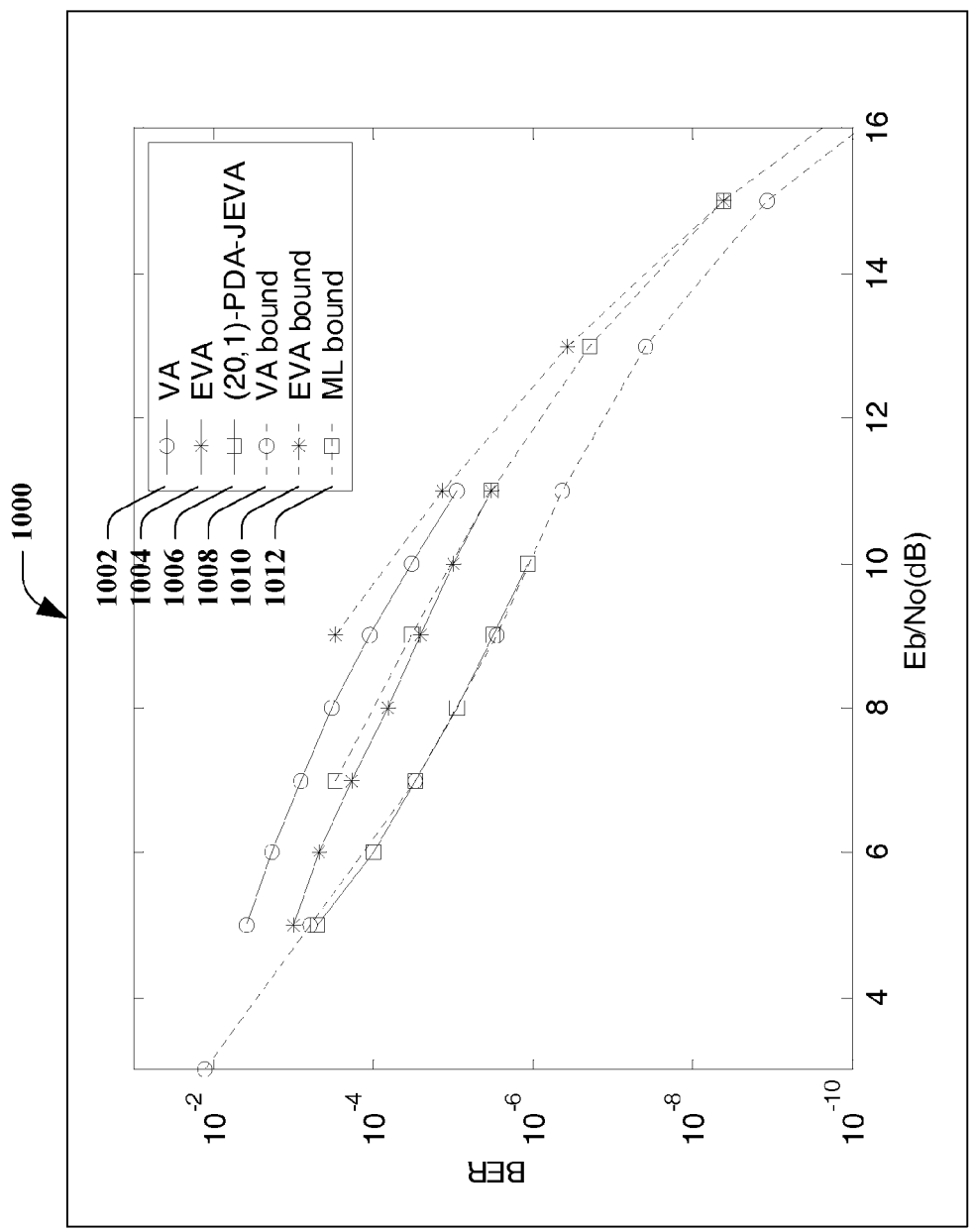
FIG. 10 depicts upper bounds for VA, EVA and ML decoder in Bernoulli-Gaussian noise with rate-½ 4-state code with a particular nonlimiting embodiment of the disclosed subject matter.
Figure 11:
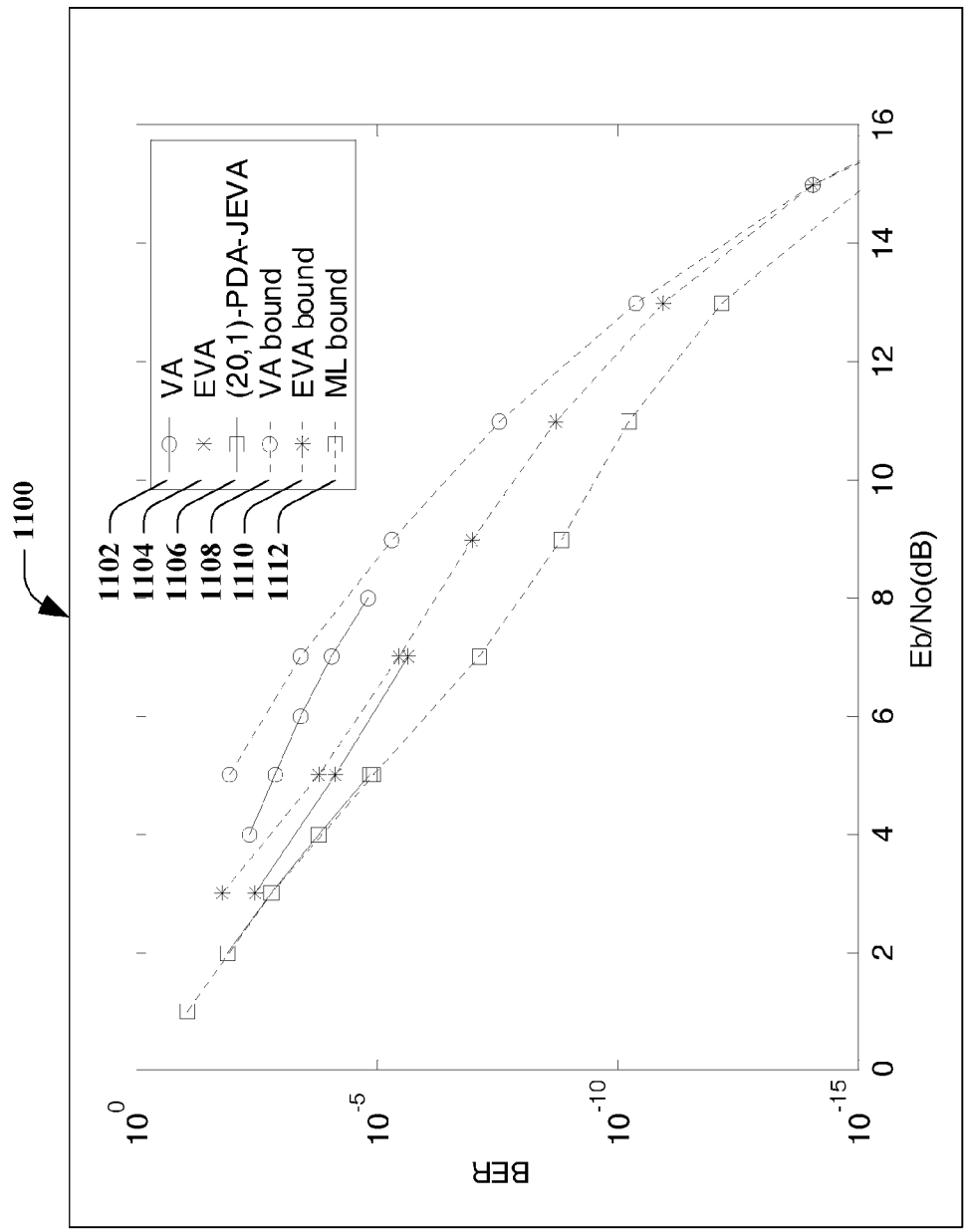
FIG. 11 depicts upper bounds for VA, EVA and ML decoder in Bernoulli-Gaussian noise with rate-½ 64-state code with a particular nonlimiting embodiment of the disclosed subject matter.

In FIGS. 9, 10, and 11, the simulated bit error rates of the VA (902, 1002, 1102), EVA (904, 1004, 1104), and MLD (906, 1006, 1106) as well as their corresponding upper bounds (VA (908, 1008, 1108), EVA (910, 1010, 1110), and MLD (912, 10126, 1112)) are presented for Bernoulli-Gaussian noise model with p=0.02 and IGR=15. FIG. 9 depicts upper bounds for Viterbi Algorithm (VA) 908, separate erasure marking VA (EVA) 910, and Maximum Likelihood (ML) 912 decoder (MLD) in Bernoulli-Gaussian noise with rate-⅔ 4-state code with a particular nonlimiting embodiment of the disclosed subject matter. FIG. 10 depicts upper bounds for VA 1008, EVA 1010, and ML 1012 decoder in Bernoulli-Gaussian noise with rate-½ 4-state code with a further nonlimiting embodiment of the disclosed subject matter. FIG. 11 depicts upper bounds for VA 1108, EVA 1110, and ML 1112 decoder in Bernoulli-Gaussian noise with rate-½ 64-state code with a further nonlimiting embodiment of the disclosed subject matter. While truncated JEVA is not shown in FIG. 11 the performance has been evaluated with a truncation window size chosen as 8 times the constraint length of code and at most K=2 erasures are marked in each window. As can be shown, with truncation, the performance is slightly worse than a particular embodiment of sequential JEVA.

The three figures are for rate-⅔ 4-state, rate-½ 4-state and rate-½ 64-state convolutional codes respectively. It can be seen that all of the three bounds derived above are rather tight and are consistent with the simulation results. As a result, it can be observed that these bounds are very useful in predicting the performance of the VA, EVA and MLD at low BER, where simulated performance becomes difficult, if not impossible. It can be observed that the performance gain of EVA over VA diminishes at high enough $E_b/N_o$. This is due to the error floor of EVA resulting from the d=0 term in (Eqn. 20). On the other hand, MLD significantly outperforms VA over a wide range of $E_b/N_o$, although the performance gain becomes smaller at very high $E_b/N_o$. The latter can be explained by the fact that the impulses dominate the performance at high $E_b/N_o$.

Because impulses are assumed to be Gaussian distributed in the Bernoulli-Gaussian noise model, the Euclidean metric becomes a good approximation of the MLD metric. As a result, the performance gain of MLD over EVA will eventually vanish at very high $E_b/N_o$. It is expected that if the impulse is assumed to have a certain non-Gaussian distribution which is more likely to be the case in practice, the performance gain of MLD over EVA and VA may be even larger at high $E_b/N_o$.

In the FIGS. 9-10, the sequential (20,1)-JEVA with the PDA sufficiency criterion, abbreviated as (20,1)-PDA-JEVA (906, 1006, 1106), is also depicted. Note that a maximum of 20 erasures is found to be sufficient in the sense that further increasing the number can only provide minor performance improvement. Further note that the average decoding passes is much smaller. For example, for the rate-½ 4-state code, the average number of decoding passes of the (20,1)-PDA-JEVA (906, 1006, 1106) is about 4 to 4.5 as can be seen from FIG. 12. FIG. 12 tabulates the average number of decoding passes for various nonlimiting embodiments of the JEVA decoding schemes in Bernoulli-Gaussian noise channel with p=0.02 and IGR=15.

The figures indicate that in spite of the lack of the knowledge of the impulsive noise PDF, the PDA-JEVA with a sufficient maximum number of erasures can nearly achieve the MLD performance in all of the simulations conducted.

Figure 13:
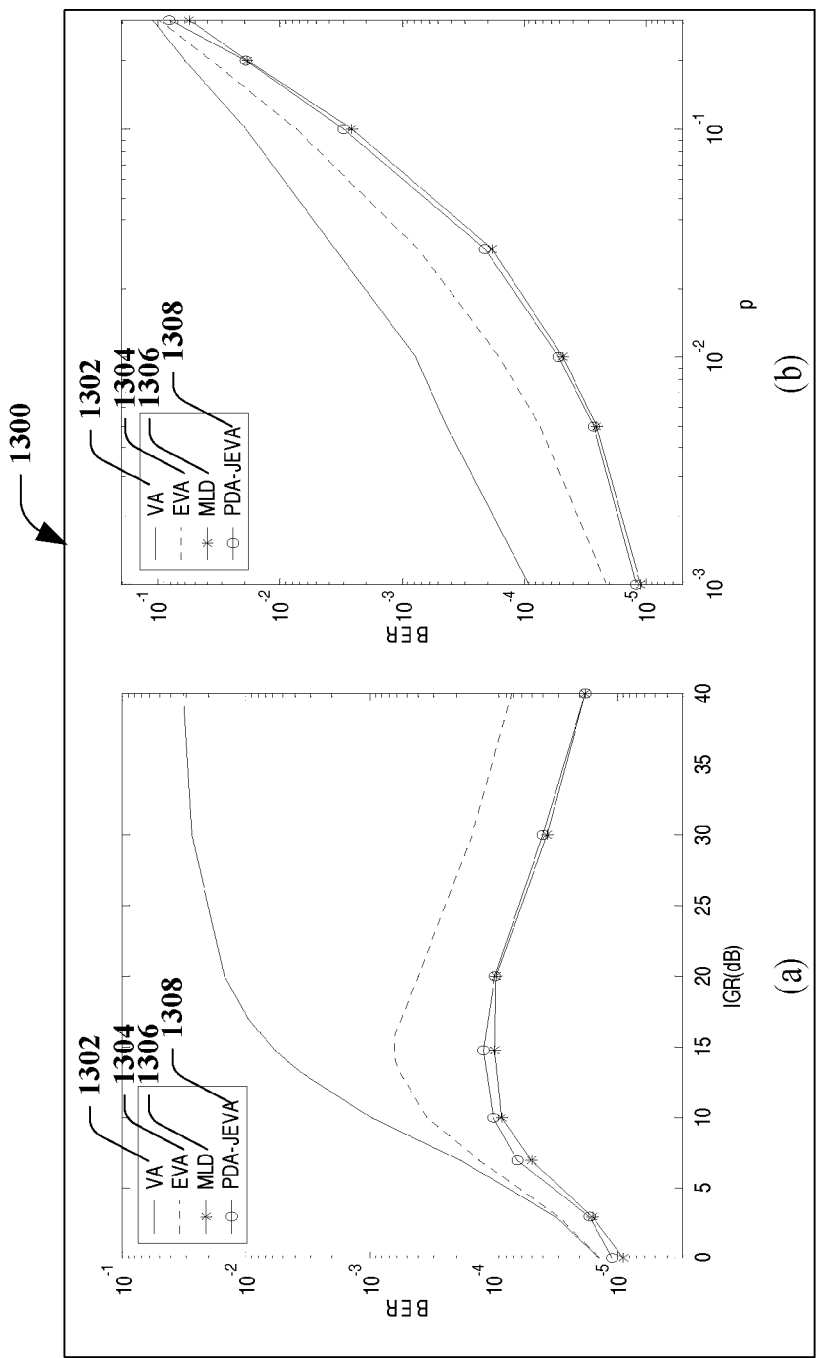

FIGS. 13(*a-b*) depict performance of a particular nonlimiting embodiment of the disclosed subject matter (e.g., path-metric-difference-aided (PDA) JEVA (PDA-JEVA)) in Bernoulli-Gaussian noise model, wherein FIG. 13(*a*) depicts the performance for p=0.02 with various IGR, and FIG. 13(*b*) IGR=15 with various p.

In FIG. 13, the VA 1302, EVA 1304, MLD 1306, and JEVA 1308 with the PDA sufficiency criterion are evaluated in the Bernoulli-Gaussian IN channel with various values of IGR and p at $E_b/N_o$=6 dB with a rate-½ 4-state convolutional code. The maximum number of erasures, K, is set to be sufficiently large in the simulation. FIG. 13(*a*) shows the BER performance of these algorithms for p=0.02 and at various values of IGR. As is understood, the IGR values of practical interest are in the range of 1 to 100, which corresponds to 0 to 20 dB. It can be observed from FIG. 13(*a*) that the PDA-JEVA 1308 can advantageously achieve almost MLD 1306 performance and outperforms the VA 1302 and EVA 1304 over a wide range of IGR values.

As expected, when IGR is very small, the impulsive noise is Gaussian like and the performance of all the four schemes is similar. When the IGR is very large, the impulse power is high and it is easy to distinguish the impulse from the Gaussian noise. In this case, the erasure marker, either separate or joint, can erase the impulse corrupted symbols with a higher accuracy. Consequently, the performance of EVA 1304, JEVA 1308, and MLD 1306 are all improved while that of VA 1302 deteriorates significantly.

In FIG. 13(*b*), the IGR is fixed at 15 and the four schemes are evaluated for various values of p. The figure demonstrates that for the useful range of the values of p, the PDA-JEVA 1308 can advantageously achieve almost MLD 1306 performance and outperforms the EVA 1304. On one hand, when the probability of the impulse arrival, p, gets very large, the system performance becomes very poor and marking more erasures than the error correction capability of the code cannot lead to improved performance. As a result, the BER performances of all the four schemes converge towards a high value. On the other hand, when the value of p gets smaller, the performance gain obtainable by erasing the impulse corrupted symbols becomes smaller and the performance difference between JEVA 1308 and EVA 1304 also decreases.

Figure 14:
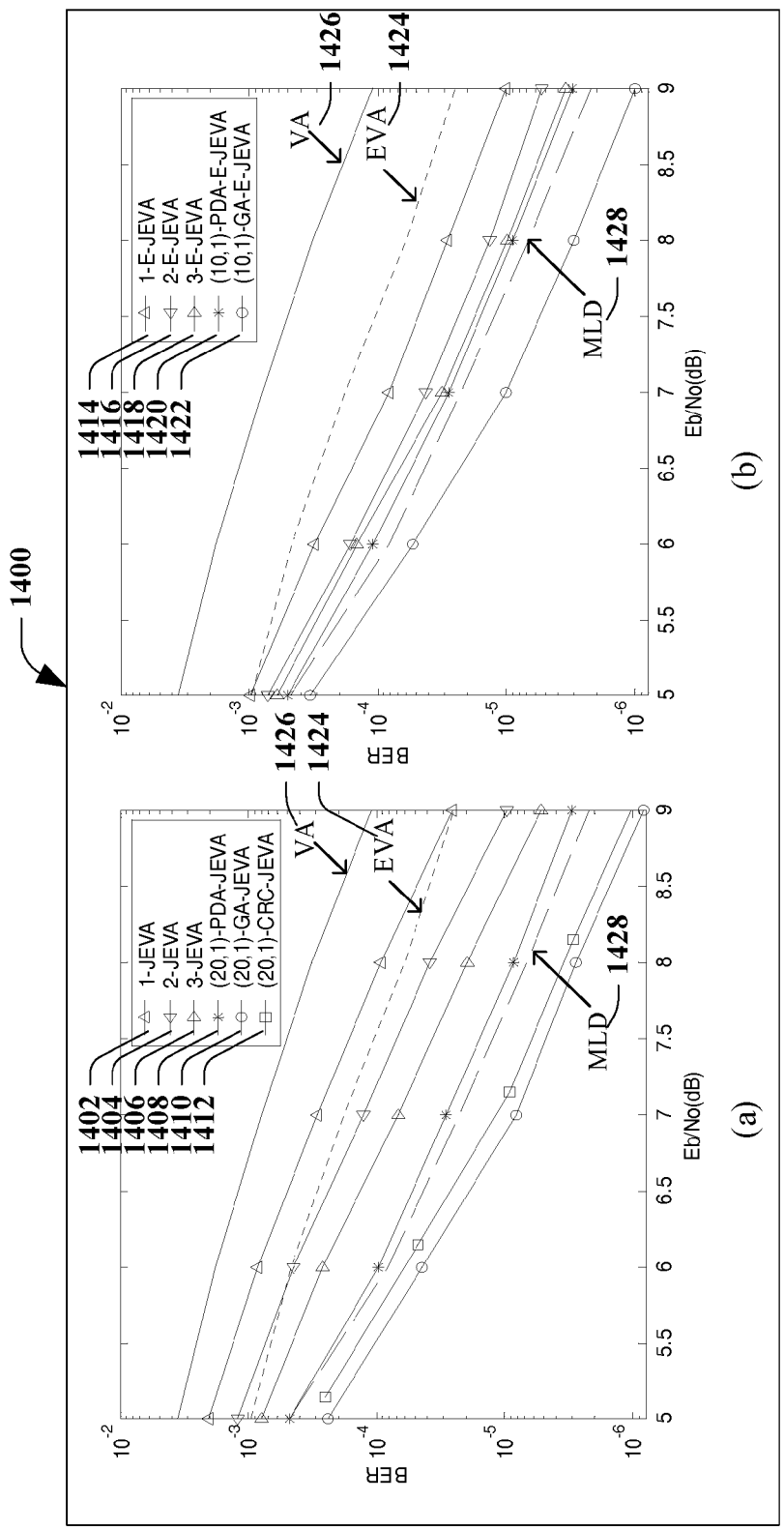

FIGS. 14(*a-b*) depict performance of particular nonlimiting embodiments of the disclosed subject matter (e.g., JEVA with fixed number of erasures and with three sufficiency criteria 1408, 1410, and 1412), wherein FIG. 14(*a*) depicts nonlimiting embodiments without separate erasure marker (1402-1412), and FIG. 14(*b*) depicts nonlimiting embodiments with separate erasure marker (1414-1422).

FIG. 14(*a*) suggests that EVA 1424 can outperform 1−JEVA 1402 although EVA 1424 is less complex. It is clear that the region based erasure marker is an effective solution for marking those relatively easy-to-mark erasures. It seems more effective to apply JEVA only after the easy-to-mark erasures are handled by the region based erasure marker. As a result, according to one aspect, the disclosed subject matter provides an erasure marker preceding JEVA (termed E-JEVA herein). Note that EVA can be viewed as E-JEVA with 0 erasure and thus E-JEVA is a generalization of EVA. In FIG. 14(*b*), the BER performance of E-JEVA with one (1414), two (1416), and three erasures (1418) is compared with those of the VA 1426, EVA 1424, and MLD 1428. From the figure, 1-E-JEVA 1414 outperforms EVA 1424 at all $E_b/N_o$.

Further performance gain can be obtained by applying 2-E-JEVA 1416 or 3-E-JEVA 1418 at the expense of a higher complexity. In the figure, the performance of (10,1)-E-JEVA with sufficiency criteria PDA (1420) and GA (1422) are also plotted. It can be seen that their respective performance is similar to the counterparts in FIG. 14(*a*), but the use of E-JEVA allows the maximum number of erasures to be reduced from 20 to 10 resulting in only half the worst-case decoding delay. Furthermore, it can also lead to a lower average complexity, as shown in FIG. 12, and will be discussed below. Note that JEVA can be viewed as a special case of E-JEVA when the region based erasure marker has an empty erasure region. In general, with the same number of erasures, E-JEVA can outperform JEVA at a lower complexity provided that the erasure marker is properly designed. The resultant performance gain is particularly remarkable when the number of erasures is small, as can be verified by comparing FIG. 14(*a*) and FIG. 14(*b*).

The average number of decoding passes of the (20,1)-JEVA with the three sufficiency criteria are tabulated in FIG.

12 according to a particular nonlimiting embodiments of the disclosed subject matter. As can be observed, the average numbers of decoding passes of the (20,1)-CRC-JEVA and the (20,1)-GA-JEVA are very similar. In particular, for $E_b/N_o \geq 7$ dB, the average number of decoding passes is only about one and hence the average complexity of (20,1)-CRC-JEVA is only about that of 1-JEVA. The (20,2)-GA-JEVA performs exactly the same as the (20,1)-GA-JEVA. Since it can mark two erasures per decoding pass, the average number of passes is reduced at 5 to 6 dB. Consequently, it requires shorter decoding delay but higher complexity. The average numbers of decoding passes of the exemplary (10,1)-GA-E-JEVA and (10,1)-PDA-E-JEVA decoding schemes of the disclosed subject matter are also tabulated in FIG. 12. The (10,1)-PDA-E-JEVA can save 1.2 to 2 decoding passes relative to (20,1)-PDA-JEVA.

Figure 15:
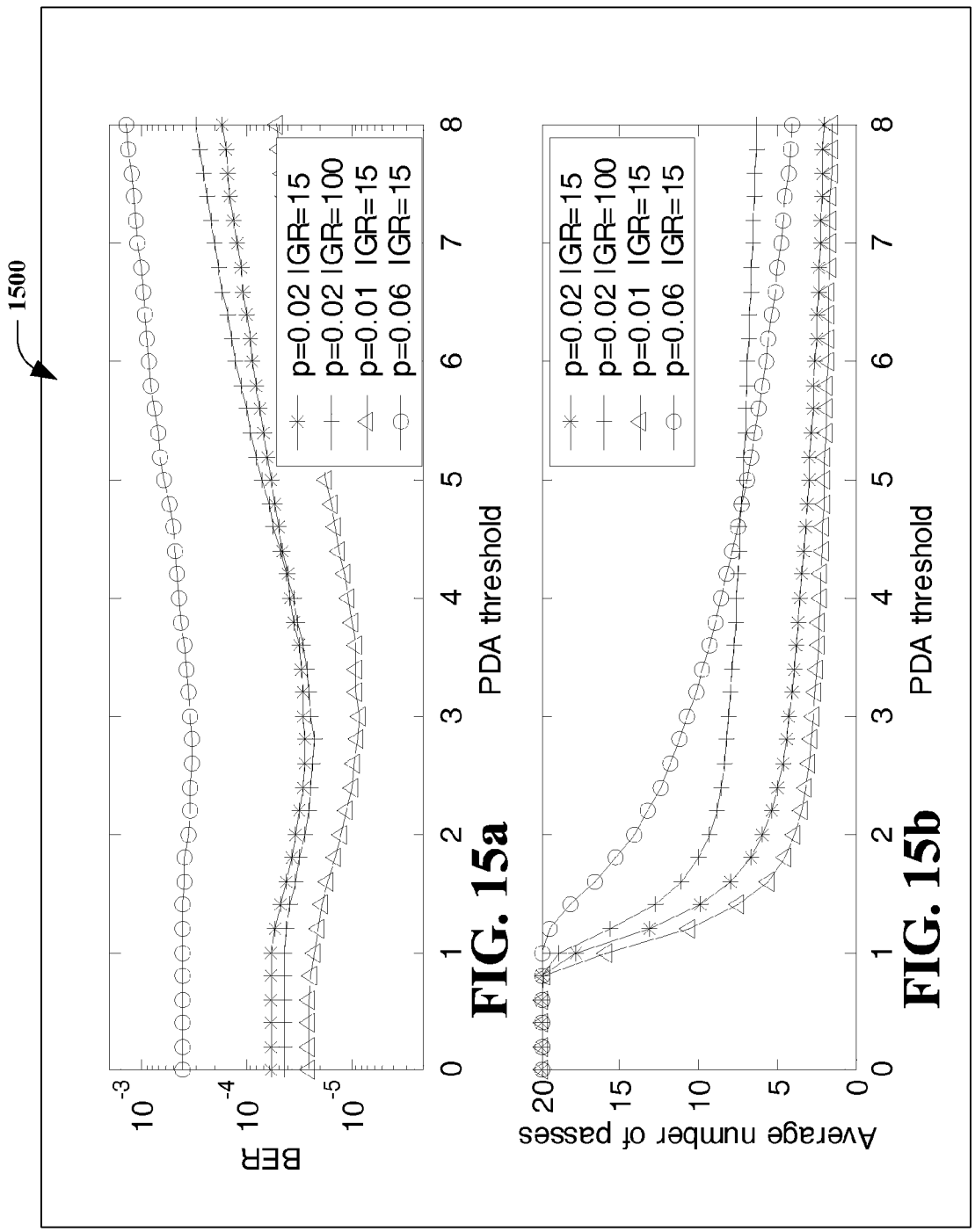
FIGS. 15(a-b) depict effects of the threshold of PDA criterion on BER (FIG. 15a) and average number of decoding passes (FIG. 15b) for (20,1)-PDA-JEVA, according to an aspect of the disclosed subject matter.

FIGS. 15(a-b) depicts effect of the threshold PDA criterion on BER and average number of decoding passes for (20,1)-PDA-JEVA, according to an aspect of the disclosed subject matter. To investigate the robustness of the system performance and complexity on the choice of the PDA threshold $\eta$, the BER and the average number of decoding passes are plotted as functions of $\eta$ for the (20,1)-PDA-JEVA with various values of IGR and p in FIG. 15 with the rate-½ 4-state convolutional code. The value of $E_b/N_o$ is chosen as 7 dB. As marking too many or too few erasures will lead to degraded performance, there exists an optimal value of $\eta$ which corresponds to the lowest BER. It can be observed that the change of the values of IGR and p has little effect on the optimal value of $\eta$. Besides, the BER curves are rather flat around their optimal values implying that the performance of PDA-JEVA is quite insensitive to the choice of the PDA threshold.

FIG. 15(b) shows that the average number of decoding passes converges towards the minimal average complexity as the value of $\eta$ increases. Note that for $p \leq 0.02$, the PDA threshold that is optimized for the BER performance also gives the practically smallest average number of decoding passes. While for p=0.06 or larger, there exists a performance-complexity tradeoff since lower complexity can be obtained by setting a higher value of $\eta$ at the price of a somehow higher BER. For practical applications, a rough estimate on the value of $E_b/N_o$ or the background Gaussian noise power is sufficient for the decoder to determine the PDA threshold.

Figure 16:
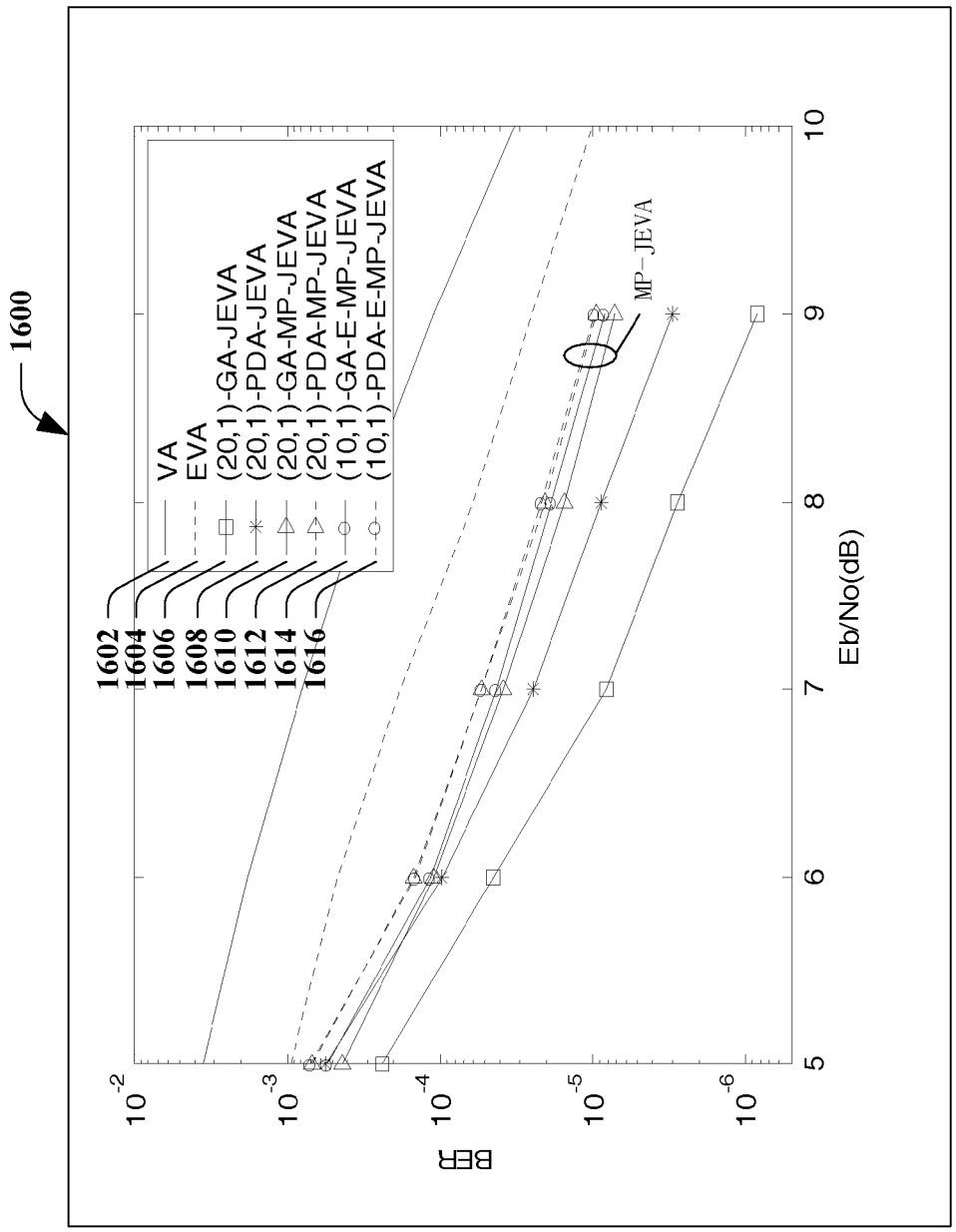
FIG. 16 depicts performance of a particular nonlimiting embodiment of the disclosed subject matter (e.g., multi-pass (MP) JEVA (MP-JEVA) with and without separate erasure marker.

FIG. 16 depicts performance of a particular nonlimiting embodiment of the disclosed subject matter (e.g., (K,1)-MP-JEVA) with and without separate erasure marker. The maximum erasure number is 20 and 10 without and with separate erasure marker respectively. It can be observed that choice of using the (K,1)-MP-JEVA scheme is entails performance tradeoffs when compared to the (K,1)-JEVA counterpart. Secondly, the (K,1)-MP-JEVA with the two sufficiency criteria perform close, which is different from the case of (K,1)-JEVA. Once an erasure is made, it will affect the further decoding passes.

As can be expected, particular nonlimiting embodiments of the algorithm suffers from error propagation as usually encountered in decision feedback schemes. For example, this can cause the correct sequence out of the candidate code sequence list to be marked and erased such that different sufficiency criteria cannot be distinguished. The average number of decoding passes of these exemplary nonlimiting embodiments of the disclosed subject matter are tabulated in FIG. 12. It can be observed that by applying the separate erasure marker to (K,1)-MP-JEVA, the average number of decoding passes for either sufficiency criterion can be reduced. Specifically, for (K,1)-PDA-MP-JEVA, around two decoding passes can be saved on average. Therefore, without significantly degrading the error rate performance, the complexity and decoding delay can be reduced.

Figure 17:
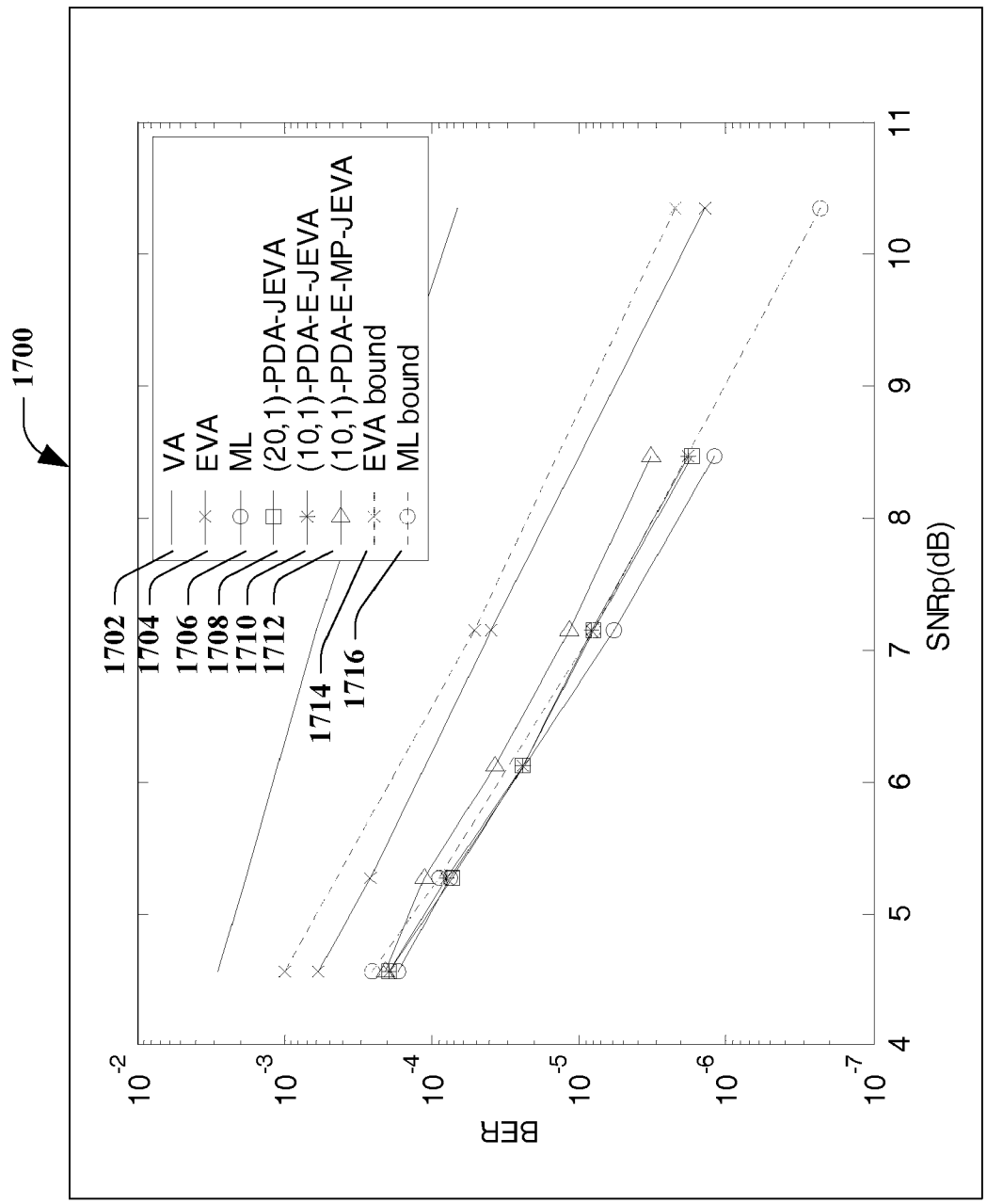
FIG. 17 depicts performance of VA, EVA, ML and particular nonlimiting embodiments of the disclosed subject matter in symmetric alpha-stable noise channel model (SαS) with α=1.8.

FIG. 17 depicts performance of VA 1702, EVA 1704, ML 1716 and particular nonlimiting embodiments of the disclosed subject matter in symmetric alpha-stable noise channel model (S$\alpha$S) with $\alpha$=1.8. Because the second order moment does not necessarily exist for the S$\alpha$S noise, the p-norm power of the noise can be introduced $$P_{N,p} = \{E[|n(k)|^p]\}^{2/p},$$

where $p < \alpha$, and $p = \alpha - 0.1$ is used in the simulations. To provide some kind of measurement of the signal-to-noise ratio, the signal-to-noise p-norm ratio can be introduced as $$SNR_p = 10 \log_{10}\left(\frac{P_{X,p}}{P_{N,p}}\right),$$

where $P_{X,p}$ is the p-norm power of the signal. It can be observed that the (20,1)-PDA-JEVA 1708 and (10, 1)-PDA-E-JEVA 1710 also achieves almost MLD 1716 performance and significantly outperform the EVA in this model. The average number of passes vary from 3.1 to 5.2 for (20,1)-PDA-JEVA 1708 for the $SNR_p$ range in FIG. 17. By applying the separate erasure marker, more than one decoding pass can be saved on average. The (10,1)-PDA-E-MP-JEVA 1712 entails tradeoffs as compared to the (10,1)-PDA-E-JEVA 1710 as expected. The average number of passes of (10,1)-PDA-E-MP-JEVA 1712 range from 1.5 to 2.5. Therefore, (10,1)-PDA-E-MP-JEVA 1712 provides a lower complexity and smaller memory requirement alternative.

Figure 18:
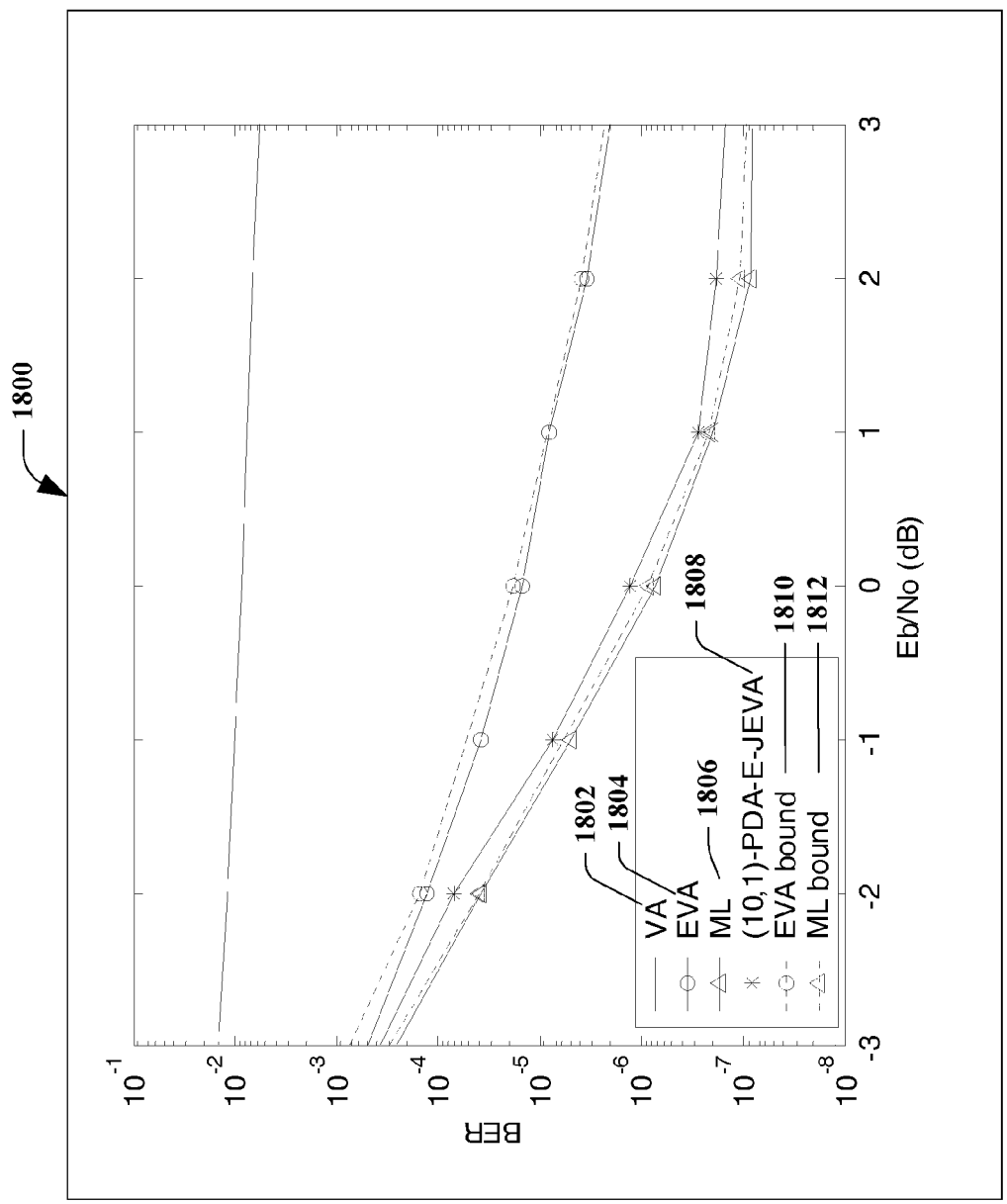
FIG. 18 depicts performance of VA, EVA, ML and a particular nonlimiting embodiment of the disclosed subject matter in Middleton'Class A model channel with Γ=0.2 and A=0.01.

FIG. 18 depicts performance of VA 1802, EVA 1804, ML 1806 and a particular nonlimiting embodiment of the disclosed subject matter in Middleton' Class A model channel with $\Gamma$=0.2 and A=0.01, wherein the performance of VA 1802, EVA 1804, ML 1806 and the (10,1)-PDA-E-JEVA 1808 are compared for the rate-½ 4-state code in FIG. 12. It can be observed that the performance of the JEVA is quite close to the ML decoder 1812 performance under this model. Moreover, the performance bounds are consistent with the simulations.

Exemplary Computer Networks and Environments

One of ordinary skill in the art can appreciate that the disclosed subject matter can be implemented in connection with any computer or other client or server device, which can be deployed as part of a communications system, a computer network, or in a distributed computing environment, connected to any kind of data store. In this regard, the disclosed subject matter pertains to any computer system or environment having any number of memory or storage units, and any number of applications and processes occurring across any number of storage units or volumes, which may be used in connection with communication systems using the decoder techniques, systems, and methods in accordance with the disclosed subject matter. The disclosed subject matter may apply to an environment with server computers and client computers deployed in a network environment or a distributed computing environment, having remote or local storage. The disclosed subject matter may also be applied to standalone computing devices, having programming language functionality, interpretation and execution capabilities for generating, receiving and transmitting information in connection with remote or local services and processes.

Distributed computing provides sharing of computer resources and services by exchange between computing devices and systems. These resources and services include the exchange of information, cache storage and disk storage for objects, such as files. Distributed computing takes advantage of network connectivity, allowing clients to leverage their collective power to benefit the entire enterprise. In this regard, a variety of devices may have applications, objects or resources that may implicate the communication systems using the decoder techniques, systems, and methods of the disclosed subject matter.

Figure 19:
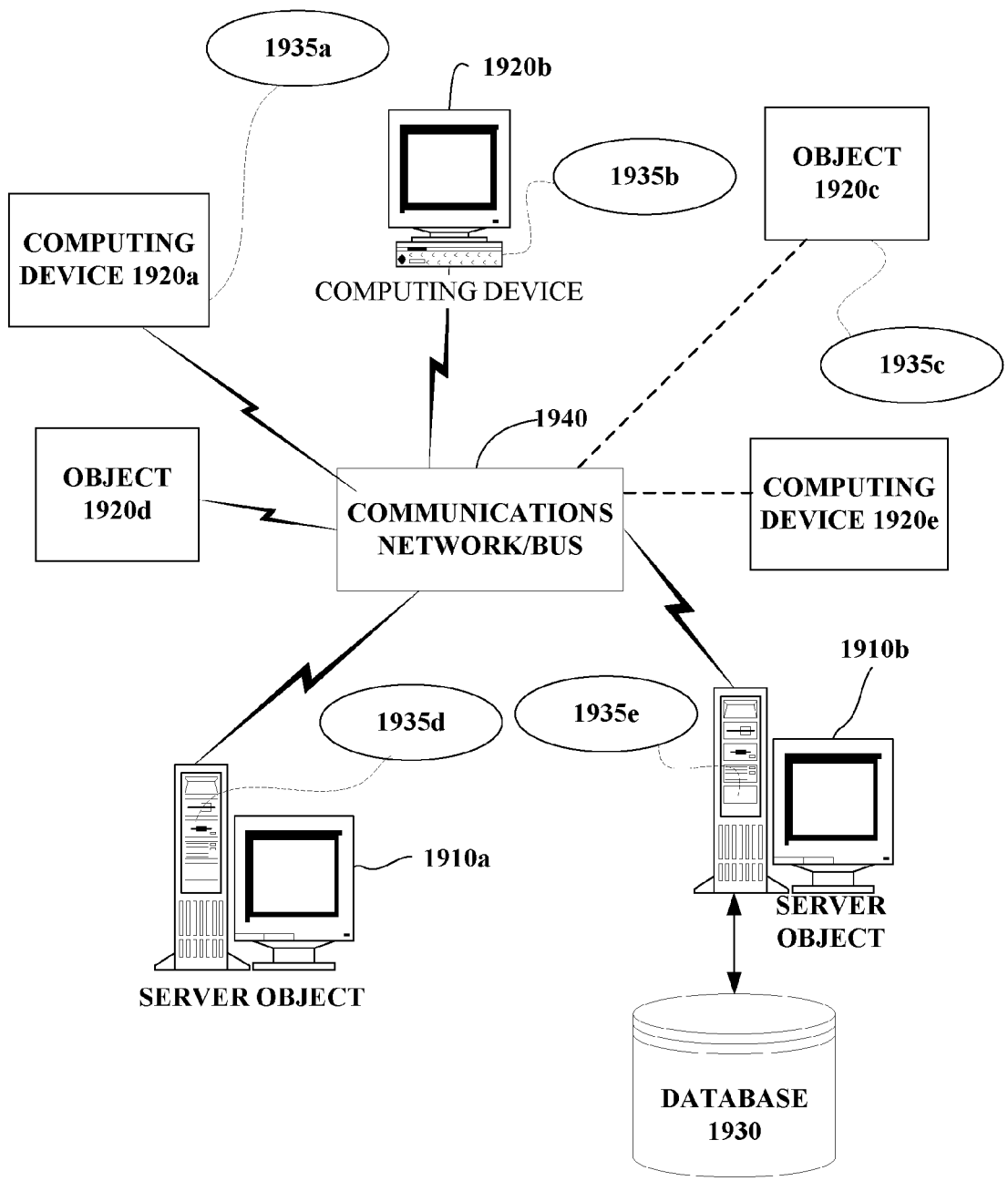
FIG. 19 is a block diagram representing an exemplary non-limiting networked environment in which aspects of the disclosed subject matter can be implemented.

FIG. 19 provides a schematic diagram of an exemplary networked or distributed computing environment. The distributed computing environment comprises computing objects 1910a, 1910b, etc. and computing objects or devices 1920a, 1920b, 1920c, 1920d, 1920e, etc. These objects may comprise programs, methods, data stores, programmable logic, etc. The objects may comprise portions of the same or different devices such as PDAs, audio/video devices, MP3 players, personal computers, etc. Each object can communicate with another object by way of the communications network 1940. This network may itself comprise other computing objects and computing devices that provide services to the system of FIG. 19, and may itself represent multiple interconnected networks. In accordance with an aspect of the disclosed subject matter, each object 1910a, 1910b, etc. or 1920a, 1920b, 1920c, 1920d, 1920e, etc. may contain an application that might make use of an API, or other object, software, firmware and/or hardware, suitable for use with the design framework in accordance with the disclosed subject matter.

It can also be appreciated that an object, such as 1920c, may be hosted on another computing device 1910a, 1910b, etc. or 1920a, 1920b, 1920c, 1920d, 1920e, etc. Thus, although the physical environment depicted may show the connected devices as computers, such illustration is merely exemplary and the physical environment may alternatively be depicted or described comprising various digital devices such as PDAs, televisions, MP3 players, etc., any of which may employ a variety of wired and wireless services, software objects such as interfaces, COM objects, and the like.

There are a variety of systems, components, and network configurations that support distributed computing environments. For example, computing systems may be connected together by wired or wireless systems, by local networks or widely distributed networks. Currently, many of the networks are coupled to the Internet, which provides an infrastructure for widely distributed computing and encompasses many different networks. Any of the infrastructures may be used for communicating information used in the communication systems using the JEVA decoder techniques, systems, and methods according to the disclosed subject matter.

The Internet commonly refers to the collection of networks and gateways that utilize the Transmission Control Protocol/Internet Protocol (TCP/IP) suite of protocols, which are well-known in the art of computer networking. The Internet can be described as a system of geographically distributed remote computer networks interconnected by computers executing networking protocols that allow users to interact and share information over network(s). Because of such wide-spread information sharing, remote networks such as the Internet have thus far generally evolved into an open system with which developers can design software applications for performing specialized operations or services, essentially without restriction.

Thus, the network infrastructure enables a host of network topologies such as client/server, peer-to-peer, or hybrid architectures. The "client" is a member of a class or group that uses the services of another class or group to which it is not related. Thus, in computing, a client is a process, e.g., roughly a set of instructions or tasks, that requests a service provided by another program. The client process utilizes the requested service without having to "know" any working details about the other program or the service itself. In a client/server architecture, particularly a networked system, a client is usually a computer that accesses shared network resources provided by another computer, e.g., a server. In the illustration of FIG. 19, as an example, computers 1920a, 1920b, 1920c, 1920d, 1920e, etc. can be thought of as clients and computers 1910a, 1910b, etc. can be thought of as servers where servers 1910a, 1910b, etc. maintain the data that is then replicated to client computers 1920a, 1920b, 1920c, 1920d, 1920e, etc., although any computer can be considered a client, a server, or both, depending on the circumstances. Any of these computing devices may be processing data or requesting services or tasks that may use or implicate the communication systems using the decoder techniques, systems, and methods in accordance with the disclosed subject matter.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to communication (wired or wirelessly) using the decoder techniques, systems, and methods of the disclosed subject matter may be distributed across multiple computing devices or objects.

Client(s) and server(s) communicate with one another utilizing the functionality provided by protocol layer(s). For example, HyperText Transfer Protocol (HTTP) is a common protocol that is used in conjunction with the World Wide Web (WWW), or "the Web." Typically, a computer network address such as an Internet Protocol (IP) address or other reference such as a Universal Resource Locator (URL) can be used to identify the server or client computers to each other. The network address can be referred to as a URL address. Communication can be provided over a communications medium, e.g., client(s) and server(s) may be coupled to one another via TCP/IP connection(s) for high-capacity communication.

Thus, FIG. 19 illustrates an exemplary networked or distributed environment, with server(s) in communication with client computer (s) via a network/bus, in which the disclosed subject matter may be employed. In more detail, a number of servers 1910a, 1910b, etc. are interconnected via a communications network/bus 1940, which may be a LAN, WAN, intranet, GSM network, the Internet, etc., with a number of client or remote computing devices 1920a, 1920b, 1920c, 1920d, 1920e, etc., such as a portable computer, handheld computer, thin client, networked appliance, or other device, such as a VCR, TV, oven, light, heater and the like in accordance with the disclosed subject matter. It is thus contemplated that the disclosed subject matter may apply to any computing device in connection with which it is desirable to communicate data over a network.

In a network environment in which the communications network/bus 1940 is the Internet, for example, the servers 1910a, 1910b, etc. can be Web servers with which the clients 1920a, 1920b, 1920c, 1920d, 1920e, etc. communicate via any of a number of known protocols such as HTTP. Servers 1910a, 1910b, etc. may also serve as clients 1920a, 1920b, 1920c, 1920d, 1920e, etc., as may be characteristic of a distributed computing environment.

As mentioned, communications to or from the systems incorporating the decoder techniques, systems, and methods of the disclosed subject matter may ultimately pass through various media, either wired or wireless, or a combination, where appropriate. Client devices 1920a, 1920b, 1920c, 1920d, 1920e, etc. may or may not communicate via communications network/bus 19, and may have independent communications associated therewith. For example, in the case of a TV or VCR, there may or may not be a networked aspect to the control thereof. Each client computer 1920a, 1920b, 1920c, 1920d, 1920e, etc. and server computer 1910a, 1910b, etc. may be equipped with various application program modules or objects 1935a, 1935b, 1935c, etc. and with connections or access to various types of storage elements or objects, across which files or data streams may be stored or to which portion(s) of files or data streams may be downloaded, transmitted or migrated. Any one or more of computers 1910a, 1910b, 1920a, 1920b, 1920c, 1920d, 1920e, etc. may be responsible for the maintenance and updating of a database 1930 or other storage element, such as a database or memory 1930 for storing data processed or saved based on communications made according to the disclosed subject matter. Thus, the disclosed subject matter can be utilized in a computer network environment having client computers 1920a, 1920b, 1920c, 1920d, 1920e, etc. that can access and interact with a computer network/bus 1940 and server computers 1910a, 1910b, etc. that may interact with client computers 1920a, 1920b, 1920c, 1920d, 1920e, etc. and other like devices, and databases 1930.

Exemplary Computing Device

Figure 20:
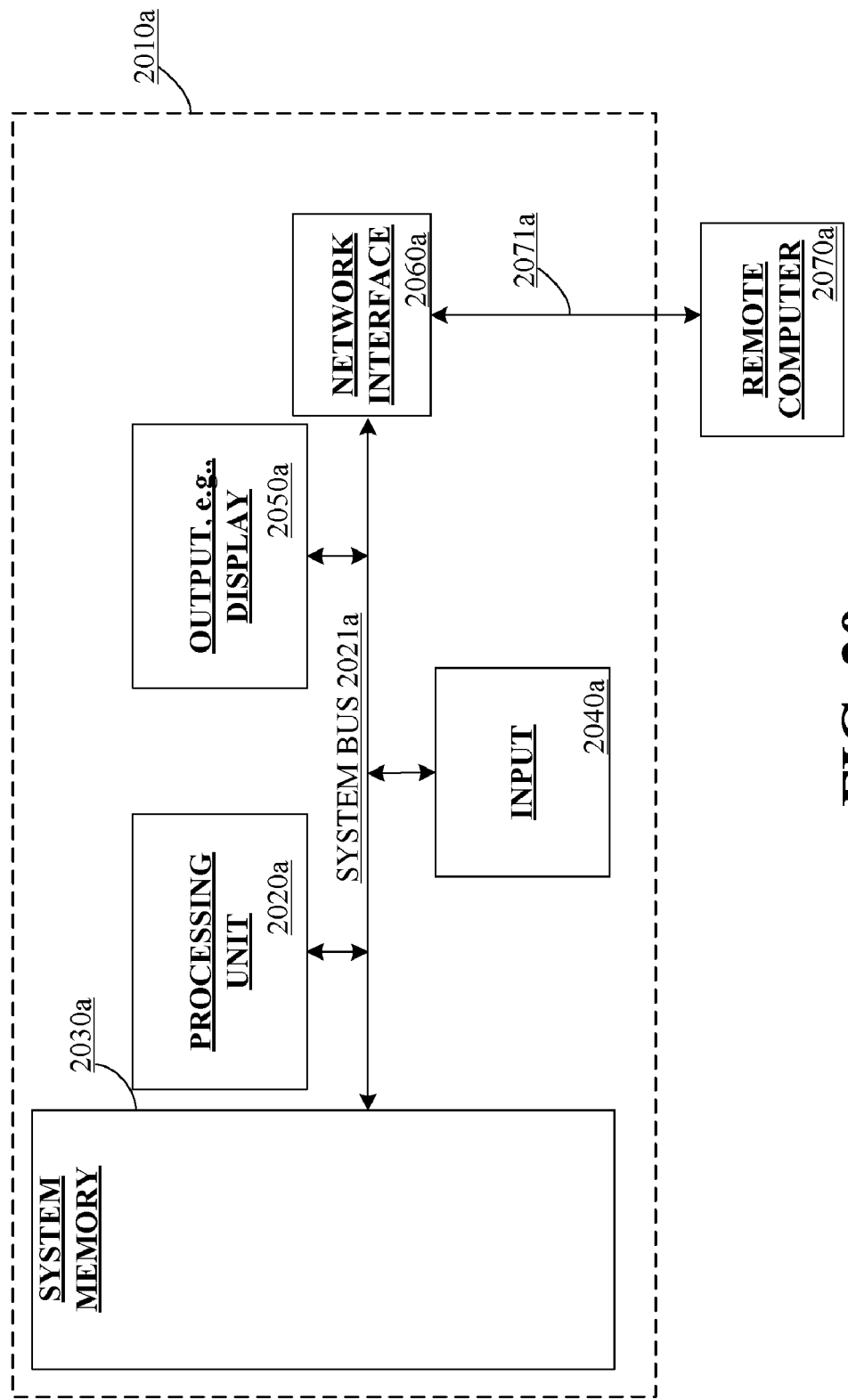
FIG. 20 is a block diagram representing an exemplary non-limiting computing system or operating environment in which the disclosed subject matter can be implemented.

As mentioned, the disclosed subject matter applies to any device wherein it may be desirable to communicate data, e.g., to or from a mobile device. It should be understood, therefore, that handheld, portable and other computing devices and computing objects of all kinds are contemplated for use in connection with the disclosed subject matter, e.g., anywhere that a device may communicate data or otherwise receive, process or store data. Accordingly, the below general purpose remote computer described below in FIG. 20 is but one example, and the disclosed subject matter may be implemented with any client having network/bus interoperability and interaction. Thus, the disclosed subject matter may be implemented in an environment of networked hosted services in which very little or minimal client resources are implicated, e.g., a networked environment in which the client device serves merely as an interface to the network/bus, such as an object placed in an appliance.

Although not required, the some aspects of the disclosed subject matter can partly be implemented via an operating system, for use by a developer of services for a device or object, and/or included within application software that operates in connection with the component(s) of the disclosed subject matter. Software may be described in the general context of computer-executable instructions, such as program modules, being executed by one or more computers, such as client workstations, servers or other devices. Those skilled in the art will appreciate that the disclosed subject matter may be practiced with other computer system configurations and protocols.

FIG. 20 thus illustrates an example of a suitable computing system environment 2000a in which some aspects of the disclosed subject matter may be implemented, although as made clear above, the computing system environment 2000a is only one example of a suitable computing environment for a media device and is not intended to suggest any limitation as to the scope of use or functionality of the disclosed subject matter. Neither should the computing environment 2000a be interpreted as having any dependency or requirement relating to any one or combination of components illustrated in the exemplary operating environment 2000a.

With reference to FIG. 20, an exemplary remote device for implementing aspects of the disclosed subject matter includes a general purpose computing device in the form of a computer 2010a. Components of computer 2010a may include, but are not limited to, a processing unit 2020a, a system memory 2030a, and a system bus 2021a that couples various system components including the system memory to the processing unit 2020a. The system bus 2021a may be any of several types of bus structures including a memory bus or memory controller, a peripheral bus, and a local bus using any of a variety of bus architectures.

Computer 2010a typically includes a variety of computer readable media. Computer readable media can be any available media that can be accessed by computer 2010a. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 2010a. Communication media typically embodies computer readable instructions, data structures, program modules or other data in a modulated data signal such as a carrier wave or other transport mechanism and includes any information delivery media.

The system memory 2030a may include computer storage media in the form of volatile and/or nonvolatile memory such as read only memory (ROM) and/or random access memory (RAM). A basic input/output system (BIOS), containing the basic routines that help to transfer information between elements within computer 2010a, such as during start-up, may be stored in memory 2030a. Memory 2030a typically also contains data and/or program modules that are immediately accessible to and/or presently being operated on by processing unit 2020a. By way of example, and not limitation, memory 2030a may also include an operating system, application programs, other program modules, and program data.

The computer 2010a may also include other removable/non-removable, volatile/nonvolatile computer storage media. For example, computer 2010a could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM and the like. A hard disk drive is typically connected to the system bus 2021a through a non-removable memory interface such as an interface, and a magnetic disk drive or optical disk drive is typically connected to the system bus 2021a by a removable memory interface, such as an interface.

A user may enter commands and information into the computer 2010a through input devices such as a keyboard and pointing device, commonly referred to as a mouse, trackball or touch pad. Other input devices may include a microphone, joystick, game pad, satellite dish, scanner, wireless device keypad, voice commands, or the like. These and other input devices are often connected to the processing unit 2020a through user input 2040a and associated interface(s) that are coupled to the system bus 2021a, but may be connected by other interface and bus structures, such as a parallel port, game port or a universal serial bus (USB). A graphics subsystem may also be connected to the system bus 2021a. A monitor or other type of display device is also connected to the system bus 2021a via an interface, such as output interface 2050a, which may in turn communicate with video memory. In addition to a monitor, computers may also include other peripheral output devices such as speakers and a printer, which may be connected through output interface 2050a.

The computer 2010a may operate in a networked or distributed environment using logical connections to one or more other remote computers, such as remote computer 2070a, which may in turn have media capabilities different from device 2010a. The remote computer 2070a may be a personal computer, a server, a router, a network PC, a peer device, personal digital assistant (PDA), cell phone, handheld computing device, or other common network node, or any other remote media consumption or transmission device, and may include any or all of the elements described above relative to the computer 2010a. The logical connections depicted in FIG. 20 include a network 2071a, such local area network (LAN) or a wide area network (WAN), but may also include other networks/buses, either wired or wireless. Such networking environments are commonplace in homes, offices, enterprise-wide computer networks, intranets and the Internet.

When used in a LAN networking environment, the computer 2010a is connected to the LAN 2071a through a network interface or adapter. When used in a WAN networking environment, the computer 2010a typically includes a communications component, such as a modem, or other means for establishing communications over the WAN, such as the Internet. A communications component, such as a modem, which may be internal or external, may be connected to the system bus 2021a via the user input interface of input 2040a, or other appropriate mechanism. In a networked environment, program modules depicted relative to the computer 2010a, or portions thereof, may be stored in a remote memory storage device. It will be appreciated that the network connections shown and described are exemplary and other means of establishing a communications link between the computers may be used.

While aspects of the disclosed subject matter has been described in connection with the preferred embodiments of the various figures, it is to be understood that other similar embodiments may be used or modifications and additions may be made to the described embodiments for performing the same functions or aspects of the disclosed subject matter without deviating therefrom. For example, one skilled in the art will recognize that the disclosed subject matter as described in the present application applies to communication systems using the disclosed JEVA decoder techniques, systems, and methods and may be applied to any number of devices connected via a communications network and interacting across the network, either wired, wirelessly, or a combination thereof. In addition, it is understood that in various network configurations, access points may act as nodes and nodes may act as access points for some purposes.

Further to the point, while for the purposes of illustration the discussion describes the techniques herein in the context of receiving and decoding communications signals (e.g., OFDM schemes with narrowband interference and convolutional coding schemes in the presence of impulsive noise), it can be appreciated that such decoder techniques can be applied to anything that can be modeled by a Hidden Markov Model (HMM) as will be described in further detail below, or more generally, any data structure suitable for representation as a time-invariant or time-varying trellis. For example, such applications can include, but are not limited to the following schemes where erasure marking is desired for combating non-Gaussian noise: soft-decision Viterbi algorithms; trellis coded modulation schemes; channels having inter-symbol interference (e.g., viterbi equalizer for wireless channels such as in a GSM system, for magnetic recording in Partial Response Maximum Likelihood (PRML) channels, etc.) pattern recognition techniques (e.g., speech recognition); and computational biology (e.g., Viterbi Exon-Intron Locator techniques).

Accordingly, while words such as transmitted and received are used in reference to the described communications processes; it should be understood that such transmitting and receiving is not limited to digital communications systems, but could encompass any manner of sending and receiving data suitable for processing by the described decoding techniques. For example, the data subject to the decoder techniques may be sent and received over any type of communications bus or medium capable of carrying the subject data from any source capable of transmitting such data. As a result, the disclosed subject matter should not be limited to any single embodiment, but rather should be construed in breadth and scope in accordance with the appended claims.

Exemplary Communications Networks and Environments

The above-described communication systems using the decoder techniques, systems, and methods may be applied to any network, however, the following description sets forth some exemplary telephony radio networks and non-limiting operating environments for communications made incident to the communication systems using the JEVA decoder techniques, systems, and methods of the disclosed subject matter. The below-described operating environments should be considered non-exhaustive, however, and thus the below-described network architecture merely shows one network architecture into which the disclosed subject matter may be incorporated. One can appreciate, however, that the disclosed subject matter may be incorporated into any now existing or future alternative architectures for communication networks as well.

The global system for mobile communication ("GSM") is one of the most widely utilized wireless access systems in today's fast growing communication systems. GSM provides circuit-switched data services to subscribers, such as mobile telephone or computer users. General Packet Radio Service ("GPRS"), which is an extension to GSM technology, introduces packet switching to GSM networks. GPRS uses a packet-based wireless communication technology to transfer high and low speed data and signaling in an efficient manner. GPRS optimizes the use of network and radio resources, thus enabling the cost effective and efficient use of GSM network resources for packet mode applications.

As one of ordinary skill in the art can appreciate, the exemplary GSM/GPRS environment and services described herein can also be extended to 3G services, such as Universal Mobile Telephone System ("UMTS"), Frequency Division Duplexing ("FDD") and Time Division Duplexing ("TDD"), High Speed Packet Data Access ("HSPDA"), cdma2000 1x Evolution Data Optimized ("EVDO"), Code Division Multiple Access-2000 ("cdma2000 3x"), Time Division Synchronous Code Division Multiple Access ("TD-SCDMA"), Wideband Code Division Multiple Access ("WCDMA"), Enhanced Data GSM Environment ("EDGE"), International Mobile Telecommunications-2000 ("IMT-2000"), Digital Enhanced Cordless Telecommunications ("DECT"), etc., as well as to other network services that shall become available in time. In this regard, the decoder techniques, systems, and methods of the disclosed subject matter may be applied independently of the method of data transport, and does not depend on any particular network architecture, or underlying protocols.

Figure 21:
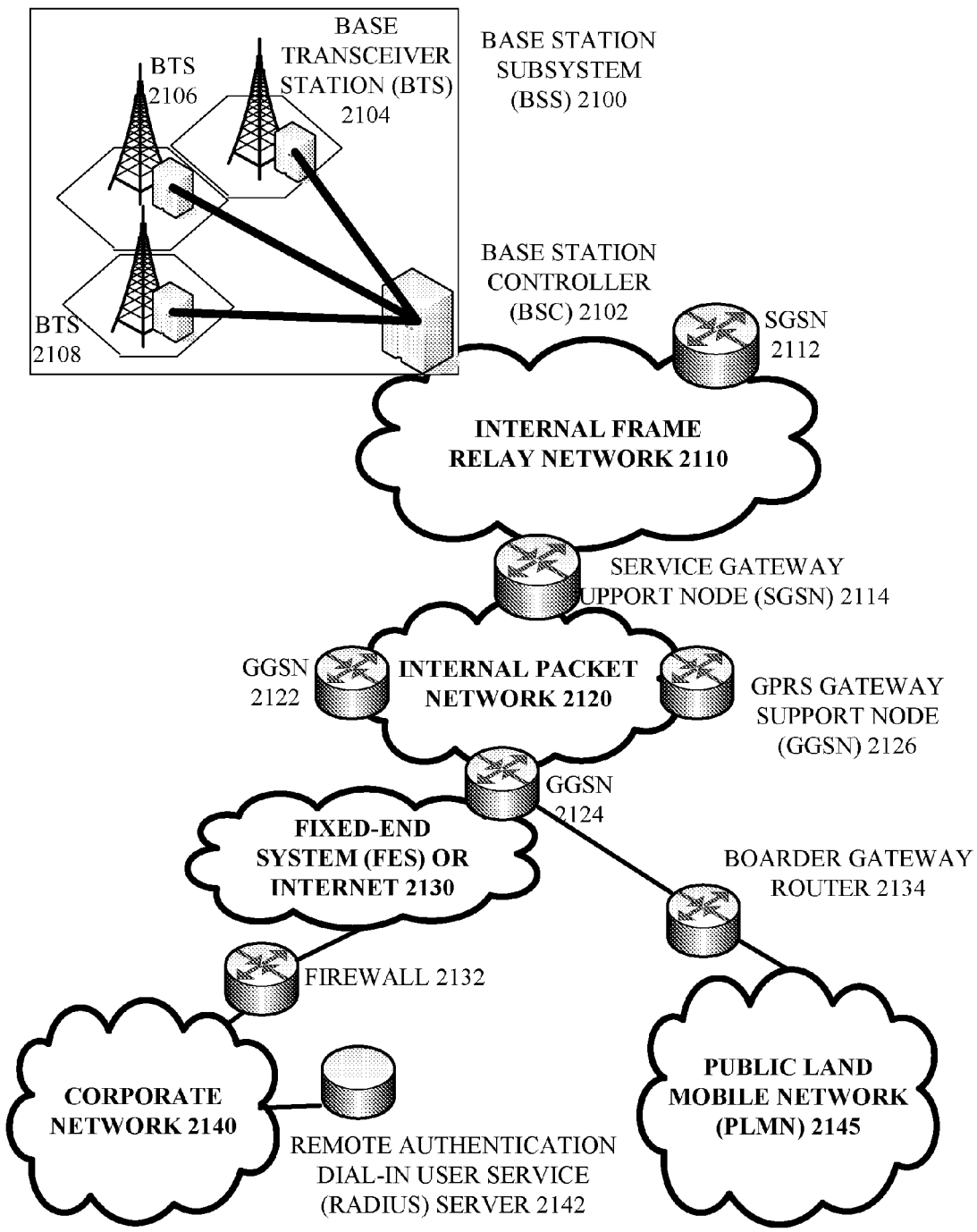
FIG. 21 illustrates an overview of a network environment suitable for service by embodiments of the disclosed subject matter.
Figure 21:
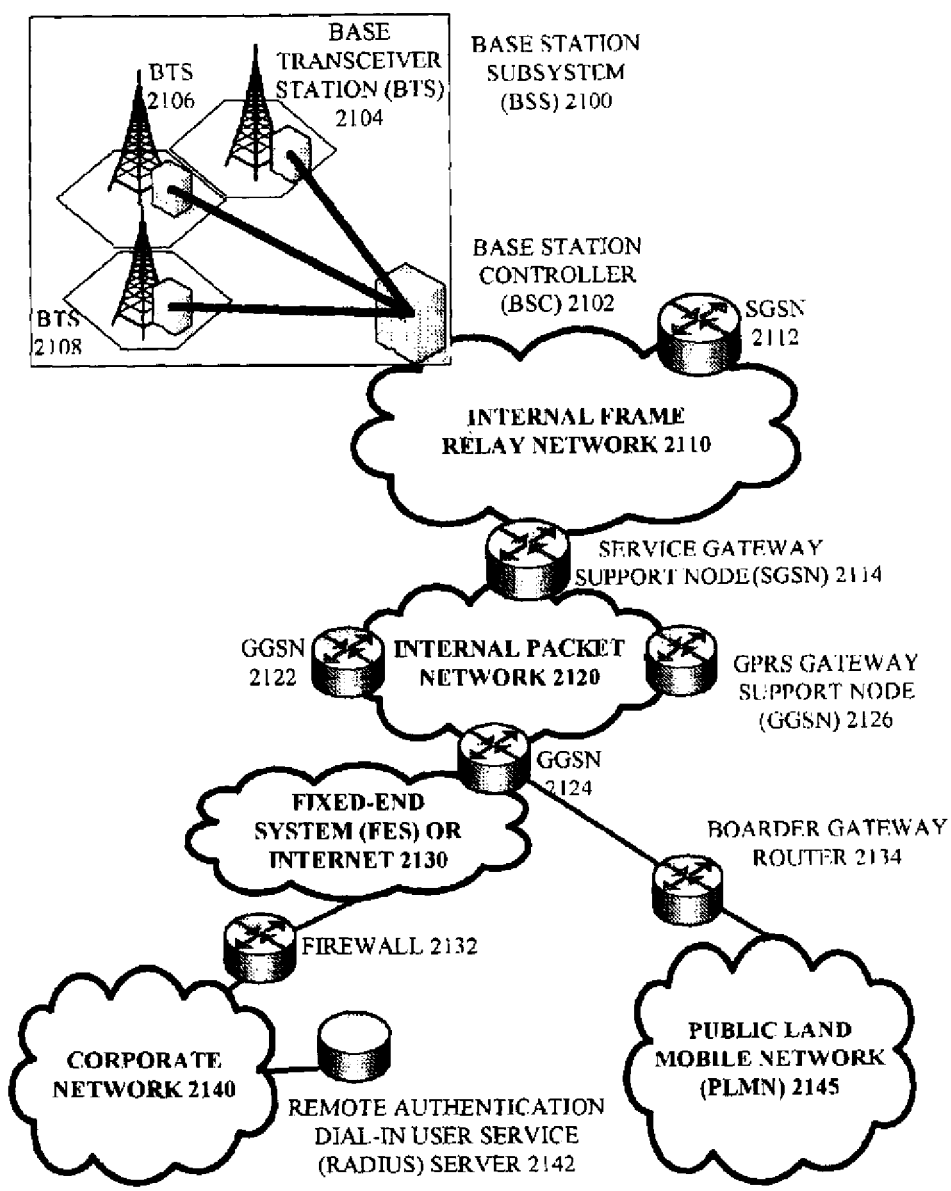

FIG. 21 depicts an overall block diagram of an exemplary packet-based mobile cellular network environment, such as a GPRS network, in which the disclosed subject matter may be practiced. In such an environment, there are a plurality of Base Station Subsystems ("BSS") 2100 (only one is shown), each of which comprises a Base Station Controller ("BSC") 2102 serving a plurality of Base Transceiver Stations ("BTS") such as BTSs 2104, 2106, and 2108. BTSs 2104, 2106, 2108, etc. are the access points where users of packet-based mobile devices become connected to the wireless network. In exemplary fashion, the packet traffic originating from user devices is transported over the air interface to a BTS 2108, and from the BTS 2108 to the BSC 2102. Base station subsystems, such as BSS 2100, are a part of internal frame relay network 2110 that may include Service GPRS Support Nodes ("SGSN") such as SGSN 2112 and 2114. Each SGSN is in turn connected to an internal packet network 2120 through which a SGSN 2112, 2114, etc. can route data packets to and from a plurality of gateway GPRS support nodes (GGSN) 2122, 2124, 2126, etc. As illustrated, SGSN 2114 and GGSNs 2122, 2124, and 2126 are part of internal packet network 2120. Gateway GPRS serving nodes 2122, 2124 and 2126 mainly provide an interface to external Internet Protocol ("IP") networks such as Public Land Mobile Network ("PLMN") 2145, corporate intranets 2140, or Fixed-End System ("FES") or the public Internet 2130. As illustrated, subscriber corporate network 2140 may be connected to GGSN 2124 via firewall 2132; and PLMN 2145 is connected to GGSN 2124 via boarder gateway router 2134. The Remote Authentication Dial-In User Service ("RADIUS") server 2142 may be used for caller authentication when a user of a mobile cellular device calls corporate network 2140.

Generally, there can be four different cell sizes in a GSM network—macro, micro, pico and umbrella cells. The coverage area of each cell is different in different environments. Macro cells can be regarded as cells where the base station antenna is installed in a mast or a building above average roof top level. Micro cells are cells whose antenna height is under average roof top level; they are typically used in urban areas. Pico cells are small cells having a diameter is a few dozen meters; they are mainly used indoors. On the other hand, umbrella cells are used to cover shadowed regions of smaller cells and fill in gaps in coverage between those cells.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

Various implementations of the disclosed subject matter described herein may have aspects that are wholly in hardware, partly in hardware and partly in software, as well as in software. Furthermore, aspects may be fully integrated into a single component, be assembled from discrete devices, or implemented as a combination suitable to the particular application and is a matter of design choice. As used herein, the terms "node," "access point," "component," "system," and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

Thus, the systems of the disclosed subject matter, or certain aspects or portions thereof, may take the form of program code (e.g., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing aspects of the disclosed subject matter. In the case of program code execution on programmable computers, the computing device generally includes a processor, a storage medium readable by the processor (including volatile and non-volatile memory and/or storage elements), at least one input device, and at least one output device.

Furthermore, the some aspects of the disclosed subject matter may be implemented as a system, method, apparatus, or article of manufacture using standard programming and/or engineering techniques to produce software, firmware, hardware, or any combination thereof to control a computer or processor based device to implement aspects detailed herein. The terms "article of manufacture", "computer program product" or similar terms, where used herein, are intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick). Additionally, it is known that a carrier wave can be employed to carry computer-readable electronic data such as those used in transmitting and receiving electronic mail or in accessing a network such as the Internet or a local area network (LAN).

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components, e.g., according to a hierarchical arrangement. Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

While for purposes of simplicity of explanation, methodologies disclosed herein are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

Furthermore, as will be appreciated various portions of the disclosed systems may include or consist of artificial intelligence or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, can automate certain mechanisms or processes performed thereby to make portions of the systems and methods more adaptive as well as efficient and intelligent.

While the disclosed subject matter has been described in connection with the particular embodiments of the various figures, it is to be understood that other similar embodiments may be used or modifications and additions may be made to the described embodiment for performing the same function of the disclosed subject matter without deviating therefrom. Still further, the disclosed subject matter may be implemented in or across a plurality of processing chips or devices, and storage may similarly be effected across a plurality of devices. Therefore, the disclosed subject matter should not be limited to any single embodiment, but rather should be construed in breadth and scope in accordance with the appended claims.

What is claimed is:

1. A method for joint erasure and Viterbi decoding, comprising:
   receiving data having a convolutional code trellis representation;
   generating a product trellis for the data by extending the convolutional code trellis representation into a bit trellis representation and obtaining the product trellis as a product of the bit trellis representation and an indicator trellis;
   truncating the product trellis by applying a sliding window to the product trellis;
   storing a surviving path for the erasure state from the sliding window;
   evaluating a subset of erasure states in the product trellis based on a predetermined number of erasures, the number of erasures is predetermined based on a number of impulses expected to impact the sliding window;
   calculating for the received data, at least one candidate code sequence and corresponding at least one state metric with at least one erasure having an erasure state;
   testing whether the at least one candidate code sequence satisfies at least one sufficiency criterion; and
   determining a subsequent iteration of the at least one candidate code sequence and corresponding at least one state metric for the data based on the calculated at least one state metric in response to the calculated at least one candidate code sequence not satisfying the at least one sufficiency criterion.

2. The method of claim 1, further comprising outputting the subsequent iteration of at least one candidate code sequence in response to the at least one sufficiency criterion remaining unsatisfied.

3. The method of claim 1, further comprising applying erasure marking to the received data prior to the calculating.

4. The method of claim 3, wherein the applying the erasure marking includes applying separate region based erasure marking.

5. The method of claim 1, wherein the testing whether the at least one candidate code sequence satisfies the at least one sufficiency criterion includes testing whether the at least one candidate code sequence satisfies at least one of an outer error detection test, an inner path metric difference threshold, a most likely code sequence, or a maximum number of erasures.

6. The method of claim 5, wherein the testing whether the at least one candidate code sequence satisfies an outer error detection test includes testing whether the at least one candidate code sequence satisfies a cyclic redundancy check.

7. The method of claim 1, wherein the calculating and determining includes calculating and determining candidate code sequences having path metrics obtained by summing branch metrics, where the calculating and determining are based on the path metrics.

8. The method of claim 1, wherein the determining a subsequent iteration includes determining a subsequent iteration of at least one candidate code sequence and corresponding at least one state metric for the data further based on the respective erasure positions in the calculating for received data.

9. The method of claim 1, further comprising:
   stopping the decoding in response to either the calculated or determined at least one candidate code sequence satisfying the at least one sufficiency criterion.

10. A system comprising:
   a receiving component configured to receive data having a convolutional code trellis representation; and
   a decoder component coupled to the receiving component and configured to:
      generate a product trellis for the data by extending the convolutional code trellis representation into a bit trellis representation and obtaining the product trellis as a product of the bit trellis representation and an indicator trellis;
      truncate the product trellis by applying a sliding window to the product trellis;
      store a surviving path for the erasure state from the sliding window;
      evaluate a subset of erasure states in the product trellis based on a number of erasures predetermined based on a number of impulses expected to impact the sliding window; and
      perform a joint erasure Viterbi decoding to simultaneously determine an optimal code sequence and at least one corresponding optimal erasure positions for the data, wherein the decoding has a number of erasure positions, and the number of erasure positions is less than a maximum allowable erasures.

11. The system of claim 10, further comprising a region based erasure marking component configured to mark erasures in the data.

12. The system of claim 10, further comprising a testing component configured to test the optimal code sequence against a sufficiency criterion.

13. The system of claim 12, wherein the sufficiency criterion includes a cyclic redundancy check.

14. A data processing apparatus for performing joint erasure and viterbi decoding, comprising:
at least one processor configured to facilitate execution of one or more computer-executable components that at least:
receive data having a convolutional code trellis representation;
generate a product trellis for the data by extending the convolutional code trellis representation into a bit trellis representation and obtaining the product trellis as a product of the bit trellis representation and an indicator trellis;
truncate the product trellis by applying a sliding window to the product trellis;
store a surviving path for the erasure state from the sliding window;
evaluate a subset of erasure states in the product trellis based on a number of erasures predetermined based on a number of impulses expected to impact the sliding window;
calculate, based on the data stored in a memory, at least one candidate code sequence and corresponding at least one state metric with at least one erasure;
test whether the at least one candidate code sequence satisfies at least one threshold determination, and
in response to the at least one candidate code sequence not satisfying the at least one threshold determination, iterate calculation for at least one of the at least one candidate code sequence and corresponding at least one state metric for the data based on the calculated at least one state metric.

15. The data processing apparatus of claim 14, wherein iteration of the at least one candidate code sequence is output in response to the at least one threshold determination remains unsatisfied.

16. The data processing apparatus of claim 14, wherein the data includes at least one of video data, audio data, speech data, or genetic information.

17. The data processing apparatus of claim 14, wherein the at least one threshold determination includes at least one of an outer error detection test, an inner path metric difference threshold, a most likely code sequence, or a maximum number of erasures.

18. The data processing apparatus of claim 14, wherein calculation of the at least one candidate code sequence and the corresponding at least one state metric is based on at least one function of path metrics based on at least one branch metric summation.

19. The data processing apparatus of claim 14, wherein the at least one processor is further configured to facilitate execution of one or more computer-executable components that at least cease to decode the data in response to at least one candidate code sequence satisfying the at least one sufficiency criterion.

* * * * *

UNITED STATES PATENT AND TRADEMARK OFFICE
CERTIFICATE OF CORRECTION

PATENT NO. : 8,185,811 B2
APPLICATION NO. : 12/192497
DATED : May 22, 2012
INVENTOR(S) : Li et al.

It is certified that error appears in the above-identified patent and that said Letters Patent is hereby corrected as shown below:

On the Face Page, in Field (56), under "OTHER PUBLICATIONS", in Column 2, Line 2, delete "Imulpsive" and insert -- Impulsive --, therefor.

In the Drawings

Drawing Fig(s) 21 should be deleted and substitute therefore the attached fig. 21 as shown on Sheet 21 of 21 of the attached pages.

In Fig. 21, Sheet 21 of 21, delete "UPPORT NODE (SGSN) 2114" and insert -- SUPPORT NODE (SGSN) 2114 --, therefor.

In Column 5, Line 44, delete "Middleton'Class" and insert -- Middleton Class --, therefor.

In Column 7, Line 60, delete "unites," and insert -- units, --, therefor.

In Column 9, Line 42, delete "rage" and insert -- range --, therefor.

In Column 10, Line 10, delete " $\lambda_b^i$ " and insert -- $\chi_b^i$ --, therefor.

In Column 20, Line 33, delete "Eucliean" and insert -- Euclidean --, therefor.

In Column 22, Line 52, delete "0.2" and insert -- 0.2. --, therefor.

Signed and Sealed this
Twenty-seventh Day of November, 2012

David J. Kappos
*Director of the United States Patent and Trademark Office*